US012699889B2

(12) United States Patent
Tran et al.

(10) Patent No.: US 12,699,889 B2
(45) Date of Patent: Aug. 4, 2026

(54) OUTPUT CIRCUITRY FOR ANALOG NEURAL MEMORY IN A DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Thuan Vu, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 1304 days.

(21) Appl. No.: 17/521,772

(22) Filed: Nov. 8, 2021

(65) Prior Publication Data

US 2023/0049032 A1 Feb. 16, 2023

Related U.S. Application Data

(60) Provisional application No. 63/228,529, filed on Aug. 2, 2021.

(51) Int. Cl.
G06N 3/065 (2023.01)
G11C 16/26 (2006.01)
(52) U.S. Cl.
CPC ............. G06N 3/065 (2023.01); G11C 16/26 (2013.01)
(58) Field of Classification Search
CPC ....... G11C 7/1051; G11C 7/22; G11C 7/1072; G11C 7/1006; G11C 7/1066
USPC .................................................... 365/189.15
See application file for complete search history.

(56) References Cited

U.S. PATENT DOCUMENTS

| | | | |
|---|---|---|---|
| 5,029,130 A | 7/1991 | Yeh | |
| 6,747,310 B2 | 6/2004 | Fan | |
| 9,202,561 B1 * | 12/2015 | Park | G11C 7/14 |
| 9,893,688 B1 | 2/2018 | Nallamothu | |
| 10,748,360 B2 | 8/2020 | Telljohann | |
| 2017/0337466 A1 | 11/2017 | Bayat et al. | |
| 2019/0205729 A1 | 7/2019 | Tran et al. | |
| 2021/0143832 A1 | 5/2021 | Fick et al. | |

FOREIGN PATENT DOCUMENTS

| | | |
|---|---|---|
| EP | 3 822 843 | 5/2021 |
| TW | I 673657 B | 10/2019 |
| TW | 202040578 A | 11/2020 |
| TW | 202105391 A | 2/2021 |

OTHER PUBLICATIONS

Taiwanese Office Action mailed on Mar. 30, 2023 corresponding to the related Taiwanese Patent Application No. 111127677.

(Continued)

*Primary Examiner* — Richard Elms
(74) *Attorney, Agent, or Firm* — Vedder Price P.C.

(57) ABSTRACT

Numerous embodiments of output circuitry for an analog neural memory in a deep learning artificial neural network are disclosed. In some embodiments, a common mode circuit is used with differential cells, W+ and W−, that together store a weight, W. The common mode circuit can utilize current sources, variable resistors, or transistors as part of the structure for introducing a common mode voltage bias.

12 Claims, 47 Drawing Sheets

(56)     References Cited

OTHER PUBLICATIONS

Japanese Office Action mailed on Nov. 26, 2024 corresponding to the related Japanese Patent Application No. 2024-501685. (Attached are copies of the Google English Translations and original copy of the Japanese Office Action.).

S. Korean Office Action mailed on Oct. 26, 2024 corresponding to the related S. Korean Patent Application No. 10-2024-7002514.

European Communication mailed on Dec. 10, 2024 corresponding to the related European Patent Application No. 21 823 428.4.

Taiwanese Office Action mailed on Nov. 21, 2023 corresponding to the related Taiwanese Patent Application No. 112137999.

PCT Search Report & Written Opinion corresponding to PCT Patent Application No. US2021/059281. Actual date of completion: Mar. 23, 2022; Date of mailing: May 30, 2022.

* cited by examiner

Memory Cell
210

FIGURE 3 (PRIOR ART)

Memory Cell
310

Memory Cell
510

Output Block
3550

Differential
Output Amplifier
4100

FIGURE 42 offset calibration method
_4200_

(4201) Start (4202) Nominal biases are applied to input nodes.

(4203) An increased offset trim setting is applied to one circuit block within an output block (4204) The new trimmed output value for the output block is measured and compared against the expected output value to see if the values are the within target value If within target output value and T tries If different (4205) After a certain number of tries (set by a threshold T), if the new trimmed output value is not within target value, then the offset trim setting is returned to the nominal setting, then the offset trim setting is decreased.

If not and fewer than T tries (4206) The new trimmed output value for the output block is measured and compared against the expected output value to see if the values are the within target value If within target value If not (4207) The trimmed value that caused the output value of the output block to be within the expected output value is stored as the stored trim value.

(4208) The stored trimmed value is added as a bias to the output block during every operation. (optional)

FIGURE 43

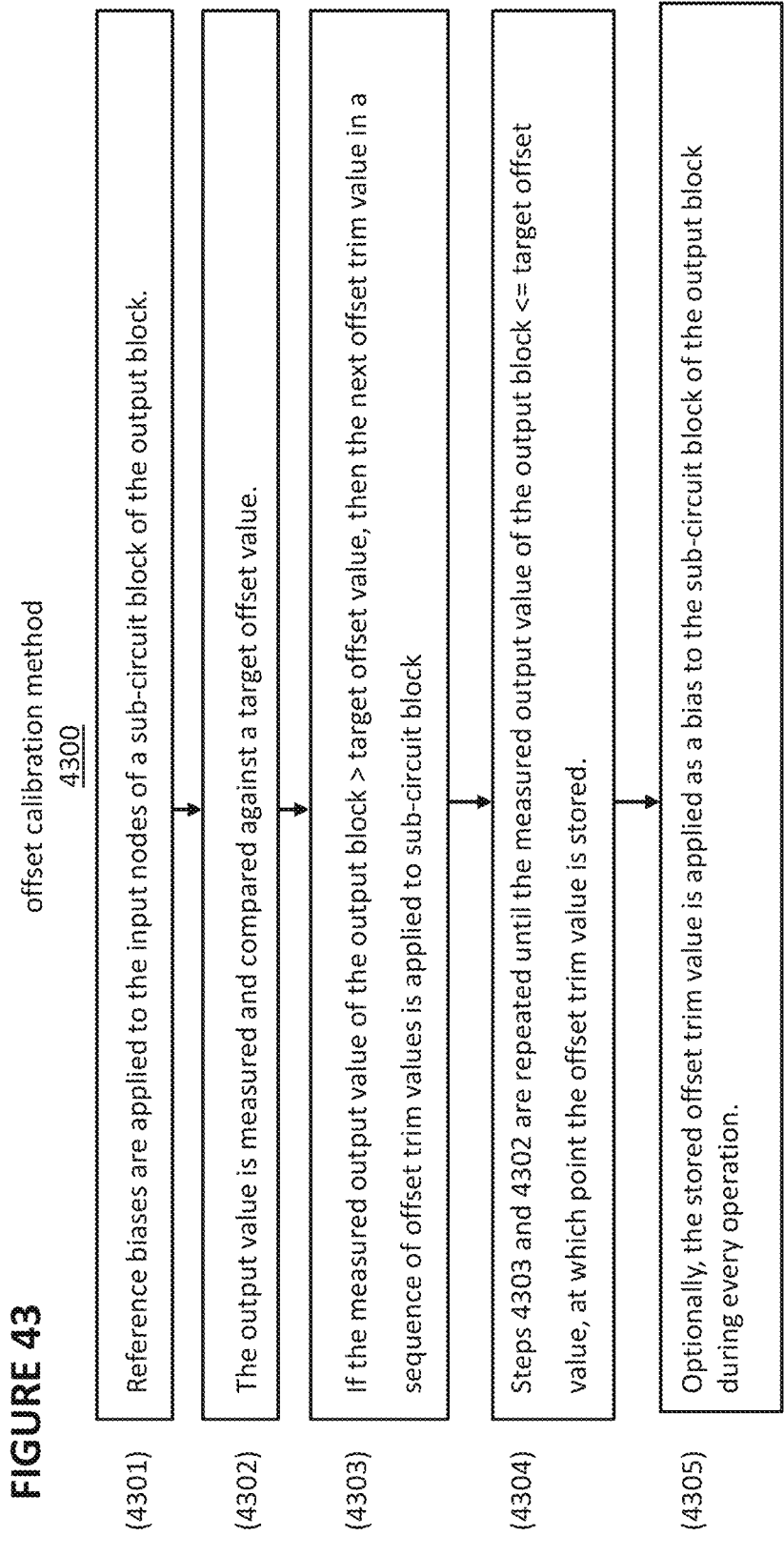

offset calibration method
4300

(4301) Reference biases are applied to the input nodes of a sub-circuit block of the output block.

(4302) The output value is measured and compared against a target offset value.

(4303) If the measured output value of the output block > target offset value, then the next offset trim value in a sequence of offset trim values is applied to sub-circuit block (4304) Steps 4303 and 4302 are repeated until the measured output value of the output block <= target offset value, at which point the offset trim value is stored.

(4305) Optionally, the stored offset trim value is applied as a bias to the sub-circuit block of the output block during every operation.

OUTPUT CIRCUITRY FOR ANALOG NEURAL MEMORY IN A DEEP LEARNING ARTIFICIAL NEURAL NETWORK

PRIORITY CLAIM

This application claims priority from U.S. Provisional Patent Application No. 63/228,529, filed on Aug. 2, 2021, and titled, "Output Circuitry for Analog Neural Memory in a Deep Learning Artificial Neural Network," which is incorporated by reference herein.

FIELD OF THE INVENTION

Numerous embodiments of output circuitry for an analog neural memory in a deep learning artificial neural network are disclosed.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e., a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as an analog neural memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Non-Volatile Memory Cells

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 210 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 110 for performing read, erase, and program operations:

3

TABLE NO. 1

| Operation of Flash Memory Cell 210 of FIG. 3 | | | |
| --- | --- | --- | --- |
| | WL | BL | SL |
| Read | 2-3 V | 0.6-2 V | 0 V |
| Erase | ~11-13 V | 0 V | 0 V |
| Program | 1-2 V | 10.5-3 μA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 310 for performing read, erase, and program operations:

TABLE NO. 2

| Operation of Flash Memory Cell 310 of FIG. 3 | | | | |
| --- | --- | --- | --- | --- |
| | WL/SG | BL | CG | EG | SL |
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 0.1-1 μA | 8-11 V | 4.5-9 V | 4.5-5 V |

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage must be applied on the source line during a program operation to compensate for a lack of control gate bias.

Table No. 3 depicts typical voltage and current ranges that can be applied to the terminals of memory cell 410 for performing read, erase, and program operations:

TABLE NO. 3

| Operation of Flash Memory Cell 410 of FIG. 4 | | | |
| --- | --- | --- | --- |
| | WL/SG | BL | EG | SL |
| Read | 0.7-2.2 V | 0.6-2 V | 0-2.6 V | 0 V |
| Erase | −0.5 V/0 V | 0 V | 11.5 V | 0 V |
| Program | 1 V | 0.2-3 μA | 4.5 V | 7-9 V |

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line) extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 210 with a higher control gate voltage.

Table No. 4 depicts typical voltage ranges that can be applied to the terminals of memory cell 510 and substrate 12 for performing read, erase, and program operations:

TABLE NO. 4

| Operation of Flash Memory Cell 510 of FIG. 5 | | | | |
| --- | --- | --- | --- | --- |
| | CG | BL | SL | Substrate |
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferro-electric ram), CT (charge trap) memory, CN (carbon-tube) memory, OTP (bi-level or multi-level one time programmable), and CeRAM (correlated electron ram), without limitation.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

FIG. 6 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of layer C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed-up output values of differential summer 38 are then supplied to an activation function block 39, which rectifies the output. The activation function block 39 may provide sigmoid, tanh, or ReLU functions. The rectified output values of activation function block 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function block 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

FIG. 8 is a block diagram depicting the usage of numerous layers of VMM arrays 32, here labeled as VMM arrays 32a, 32b, 32c, 32d, and 32e. As shown in FIG. 8, the input, denoted Inputx, is converted from digital to analog by a digital-to-analog converter 31 and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-by-Matrix Multiplication (VMM) Arrays

FIG. 9 depicts neuron VMM array 900, which is particularly suited for memory cells 310 as shown in FIG. 3 and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 900, i.e. the memory cells 310 of VMM array 900, are preferably configured to operate in a sub-threshold region.

The non-volatile reference memory cells and the non-volatile memory cells described herein are biased in weak inversion (sub threshold region):

$$Ids=Io*e^{(Vg-Vth)/nVt}=w*Io*e^{(Vg)/nVt},$$

$$\text{where } w=e^{(-Vth)/nVt}$$

where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+ (Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current into an input voltage:

$$Vg=n*Vt*\log [Ids/wp*Io]$$

where, wp is w of a reference or peripheral memory cell.

For a memory array used as a vector matrix multiplier VMM array with the current input, the output current is:

$$Iout=wa*Io*e^{(Vg)/nVt}, \text{ namely}$$

$$Iout=(wa/wp)*Iin=W*Iin$$

$$W=e^{(Vthp-Vtha)nVt}$$

Here, wa=w of each memory cell in the memory array. Vthp is effective threshold voltage of the peripheral memory cell and Vtha is effective threshold voltage of the main (data) memory cell. Note that the threshold voltage of a transistor is a function of substrate body bias voltage and the substrate body bias voltage, denoted Vsb, can be modulated to compensate for various conditions, on such temperature. The threshold voltage Vth can be expressed as:

$$Vth=Vth0+gamma(SQRT|Vsb-2*\varphi F|)-SQRT|2*\varphi F|)$$

Where Vth0 is threshold voltage with zero substrate bias, φF is a surface potential, and gamma is a body effect parameter.

A wordline or control gate can be used as the input for the memory cell for the input voltage.

Alternatively, the flash memory cells of VMM arrays described herein can be configured to operate in the linear region:

$$Ids=beta*(Vgs-Vth)*Vds; beta=u*Cox*Wt/L$$

$$W=\alpha(Vgs-Vth)$$

meaning weight W in the linear region is proportional to (Vgs–Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region can be used to linearly convert an input/output current into an input/output voltage.

Alternatively, the memory cells of VMM arrays described herein can be configured to operate in the saturation region:

$$Ids=\tfrac{1}{2}*beta*(Vgs-Vth)^2; beta=u*Cox*Wt/L$$

$$W\alpha(Vgs-Vth)^2, \text{ meaning weight } W \text{ is proportional to} (Vgs-Vth)^2$$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

Other embodiments for VMM array 32 of FIG. 7 are described in U.S. Pat. No. 10,748,630, which is incorporated by reference herein. As described in that application, a sourceline or a bitline can be used as the neuron output (current summation output).

FIG. 10 depicts neuron VMM array 1000, which is particularly suited for memory cells 210 as shown in FIG. 2 and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (only partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3)

an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages and currents for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

| Operation of VMM Array 1100 of FIG. 11 | | | | | |
|---|---|---|---|---|---|
| | WL | WL-unsel | BL | BL-unsel | SL | SL-unsel |
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT | by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages and currents for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 5

| Operation of VMM Array 1000 of FIG. 10: | | | | | |
|---|---|---|---|---|---|
| | WL | W-unsel | BL | BL-unsel | SL | SL-unsel |
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 11 depicts neuron VMM array 1100, which is particularly suited for memory cells 210 as shown in FIG. 2 and is utilized as the synapses and parts of neurons between FIG. 12 depicts neuron VMM array 1200, which is particularly suited for memory cells 310 as shown in FIG. 3 and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (only partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. If too much charge is placed on the floating gate (such that the wrong value is stored in the cell), the cell is erased and the sequence of partial programming operations starts over. As shown, two rows sharing the same erase gate (such as EG0 or EG1) are erased together (which is known as a page erase), and thereafter, each cell is partially programmed until the desired charge on the floating gate is reached.

Table No. 7 depicts operating voltages and currents for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bitlines BL0-BLN, where each bit line sums all currents from the non-volatile memory cells connected to that particular bitline.

Table No. 8 depicts operating voltages and currents for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

| | | | | | | CG-unsel same sector | CG-unsel | | EG-unsel | | SL-unsel |
|---|---|---|---|---|---|---|---|---|---|---|---|
| | WL | WL-unsel | BL | BL-unsel | CG | | | EG | | SL | |
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Operation of VMM Array 1200 of FIG. 12

TABLE NO. 8

Operation of VMM Array 1300 of FIG. 13

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | -0.5 V/ 0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | -0.5 V/ 0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 22 depicts neuron VMM array 2200, which is particularly suited for memory cells 210 as shown in FIG. 2 and is utilized as the synapses and parts of neurons between an input layer and the next layer. In VMM array 2200, the inputs $INPUT_0 \ldots, INPUT_N$ are received on bit lines $BL_0, \ldots BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

FIG. 23 depicts neuron VMM array 2300, which is particularly suited for memory cells 210 as shown in FIG. 2 and is utilized as the synapses and parts of neurons between an input layer and the next layer. In this example, the inputs $INPUT_0$, $INPUT_1$, $INPUT_2$, and $INPUT_3$ are received on source lines $SL_0$, $SL_1$, $SL_2$, and $SL_3$, respectively, and the outputs $OUTPUT_0, \ldots OUTPUT_N$ are generated on bit lines $BL_0, \ldots, BL_N$.

FIG. 24 depicts neuron VMM array 2400, which is particularly suited for memory cells 210 as shown in FIG. 2, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

FIG. 25 depicts neuron VMM array 2500, which is particularly suited for memory cells 310 as shown in FIG. 3, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

FIG. 26 depicts neuron VMM array 2600, which is particularly suited for memory cells 410 as shown in FIG. 4, and is utilized as the synapses and parts of neurons between an input layer and the next layer. In this example, the inputs $INPUT_0, \ldots, INPUT_n$ are received on vertical control gate lines $CG_0, \ldots, CG_N$, respectively, and the outputs $OUTPUT_1$ and $OUTPUT_2$ are generated on source lines $SL_0$ and $SL_1$.

FIG. 27 depicts neuron VMM array 2700, which is particularly suited for memory cells 410 as shown in FIG. 4, and is utilized as the synapses and parts of neurons between an input layer and the next layer. In this example, the inputs $INPUT_0, \ldots, INPUT_N$ are received on the gates of bit line control gates 2701-1, 2701-2, . . . , 2701-(N-1), and 2701-N, respectively, which are coupled to bit lines $BL_0, \ldots, BL_N$, respectively. Exemplary outputs $OUTPUT_1$ and $OUTPUT_2$ are generated on source lines $SL_0$ and $SL_1$.

FIG. 28 depicts neuron VMM array 2800, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on word lines $WL_0, \ldots, WL_M$, and the outputs $OUTPUT_0, \ldots, OUTPUT_N$ are generated on bit lines $BL_0, \ldots, BL_N$, respectively.

FIG. 29 depicts neuron VMM array 2900, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical source lines $SL_0, \ldots, SL_N$, respectively, where each source line $SL_i$ is coupled to the source lines of all memory cells in column i.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical bit lines $BL_0, \ldots, BL_N$, respectively, where each bit line $BL_i$ is coupled to the bit lines of all memory cells in column i.

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

FIG. 14 depicts an exemplary LSTM 1400. LSTM 1400 in this example comprises cells 1401, 1402, 1403, and 1404. Cell 1401 receives input vector $x_0$ and generates output vector $h_0$ and cell state vector $c_0$. Cell 1402 receives input vector $x_1$, the output vector (hidden state) $h_0$ from cell 1401, and cell state $c_0$ from cell 1401 and generates output vector $h_1$ and cell state vector $c_1$. Cell 1403 receives input vector $x_2$, the output vector (hidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

FIG. 15 depicts an exemplary implementation of an LSTM cell 1500, which can be used for cells 1401, 1402, 1403, and 1404 in FIG. 14. LSTM cell 1500 receives input vector x(t), cell state vector c(t-1) from a preceding cell, and output vector h(t−1) from a preceding cell, and generates cell state vector c(t) and output vector h(t).

LSTM cell 1500 comprises sigmoid function devices 1501, 1502, and 1503, each of which applies a number between 0 and 1 to control how much of each component in the input vector is allowed through to the output vector. LSTM cell 1500 also comprises tanh devices 1504 and 1505 to apply a hyperbolic tangent function to an input vector, multiplier devices 1506, 1507, and 1508 to multiply two vectors together, and addition device 1509 to add two vectors together. Output vector h(t) can be provided to the next LSTM cell in the system, or it can be accessed for other purposes.

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tanh device 1504 each comprise multiple VMM arrays 1601 and activation function blocks 1602. Thus, it can be seen that VMM arrays are particular useful in LSTM cells used in certain neural network systems. The multiplier devices 1506, 1507, and 1508 and the addition device 1509 are implemented in a digital manner or in an analog manner. The activation function blocks 1602 can be implemented in a digital manner or in an analog manner.

An alternative to LSTM cell 1600 (and another example of an implementation of LSTM cell 1500) is shown in FIG. 17. In FIG. 17, sigmoid function devices 1501, 1502, and 1503 and tanh device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tanh device 1505 (which comprises activation function block 1702), register 1707 to store the value i(t) when i(t) is output from sigmoid function block 1702, register 1704 to store the value f(t)*c(t−1) when that value is output from multiplier device 1703 through multiplexor 1710, register 1705 to store the value i(t)*u(t) when that value is output from multiplier device 1703 through multiplexor 1710, and register 1706 to store the value o(t)*c~(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains only one set of VMM arrays 1701 and activation function block 1702, which are used to represent multiple layers in the embodiment of LSTM cell 1700. LSTM cell 1700 will require less space than LSTM 1600, as LSTM cell 1700 will require ¼ as much space for VMMs and activation function blocks compared to LSTM cell 1600.

It can be further appreciated that LSTM units will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The embodiments described below therefore reduce the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

FIG. 18 depicts an exemplary GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

FIG. 19 depicts an exemplary implementation of a GRU cell 1900, which can be used for cells 1801, 1802, 1803, and 1804 of FIG. 18. GRU cell 1900 receives input vector x(t) and output vector h(t−1) from a preceding GRU cell and generates output vector h(t). GRU cell 1900 comprises sigmoid function devices 1901 and 1902, each of which applies a number between 0 and 1 to components from output vector h(t−1) and input vector x(t). GRU cell 1900 also comprises a tanh device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tanh device 1903 each comprise multiple VMM arrays 2001 and activation function blocks 2002. Thus, it can be seen that VMM arrays are of particular use in GRU cells used in certain neural network systems. The multiplier devices 1904, 1905, 1906, the addition device 1907, and the complementary device 1908 are implemented in a digital manner or in an analog manner. The activation function blocks 2002 can be implemented in a digital manner or in an analog manner.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tanh device 1903 share the same physical hardware (VMM arrays 2101 and activation function block 2102) in a time-multiplexed fashion. GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1)*r(t) when that value is output from multiplier device 2103 through multiplexor 2104, register 2107 to hold the value h(t−1)*z(t) when that value is output from multiplier device 2103 through multiplexor 2104, and register 2108 to hold the value h^(t)*(1−z(t)) when that value is output from multiplier device 2103 through multiplexor 2104.

Whereas GRU cell 2000 contains multiple sets of VMM arrays 2001 and activation function blocks 2002, GRU cell 2100 contains only one set of VMM arrays 2101 and activation function block 2102, which are used to represent multiple layers in the embodiment of GRU cell 2100. GRU cell 2100 will require less space than GRU cell 2000, as GRU cell 2100 will require ⅓ as much space for VMMs and activation function blocks compared to GRU cell 2000.

It can be further appreciated that GRU systems will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The embodiments described below therefore reduce the circuitry required outside of the VMM arrays themselves.

The input to the VMM arrays can be an analog level, a binary level, a pulse, a time modulated pulse, or digital bits (in this case a DAC is needed to convert digital bits to appropriate input analog level) and the output can be an analog level, a binary level, a timing pulse, pulses, or digital bits (in this case an output ADC is needed to convert output analog level into digital bits).

In general, for each memory cell in a VMM array, each weight W can be implemented by a single memory cell or by a differential cell or by two blend memory cells (average of 2 cells). In the differential cell case, two memory cells are needed to implement a weight W as a differential weight (W=W+−W−). In the two blend memory cells, two memory cells are needed to implement a weight W as an average of two cells.

FIG. 31 depicts VMM system 3100. In some embodiments, the weights, W, stored in a VMM array are stored as differential pairs, W+ (positive weight) and W− (negative weight), where W=(W+)−(W−). In VMM system 3100, half of the bit lines are designated as W+ lines, that is, bit lines connecting to memory cells that will store positive weights W+, and the other half of the bit lines are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3101 and 3102. The output of a W+ line and the output of a W− line are combined together to give effectively W=W+−W− for each pair of (W+, W−) cells for all pairs of (W+, W−) lines. While the above has been described in relation to W− lines interspersed among the W+ lines in an alternating fashion, in other embodiments W+ lines and W− lines can be arbitrarily located anywhere in the array.

FIG. 32 depicts another embodiment. In VMM system 3210, positive weights W+ are implemented in first array 3211 and negative weights W− are implemented in a second array 3212, second array 3212 separate from the first array, and the resulting weights are appropriately combined together by summation circuits 3213.

FIG. 33 depicts VMM system 3300, the weights, W, stored in a VMM array are stored as differential pairs, W+ (positive weight) and W− (negative weight), where W=(W+)−(W−). VMM system 3300 comprises array 3301 and array 3302. Half of the bit lines in each of array 3301 and 3302 are designated as W+ lines, that is, bit lines connecting to memory cells that will store positive weights W+, and the other half of the bit lines in each of array 3301 and 3302 are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3303,

3304, 3305, and 3306. The output of a W+ line and the output of a W− line from each array 3301, 3302 are respectively combined together to give effectively W=W+−W− for each pair of (W+, W−) cells for all pairs of (W+, W−) lines. In addition, the W values from each array 3301 and 3302 can be further combined through summation circuits 3307 and 3308, such that each W value is the result of a W value from array 3301 minus a W value from array 3302, meaning that the end result from summation circuits 3307 and 3308 is a differential value of two differential values.

Each non-volatile memory cells used in the analog neural memory system is to be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

Similarly, a read operation must be able to accurately discern between N different levels.

There is a need in VMM systems for improved output blocks that can quickly and accurately receive outputs from an array and discern the values represented by those outputs.

SUMMARY OF THE INVENTION

Numerous embodiments of output circuitry for an analog neural memory in a deep learning artificial neural network are disclosed.

BRIEF DESCRIPTION OF THE DRAWINGS

Figure 3:
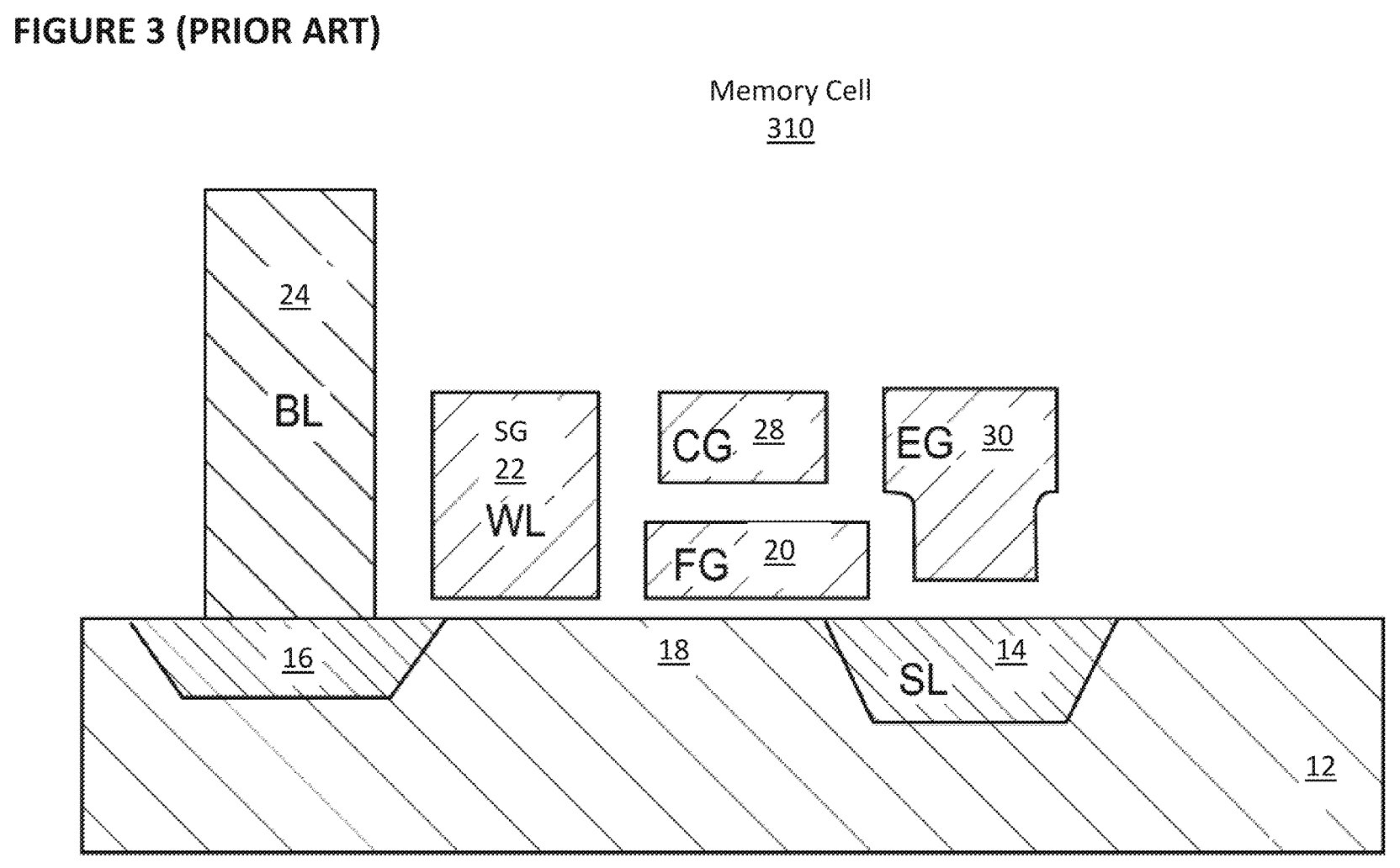

FIG. 3 depicts another prior art split gate flash memory cell.

Figure 17:
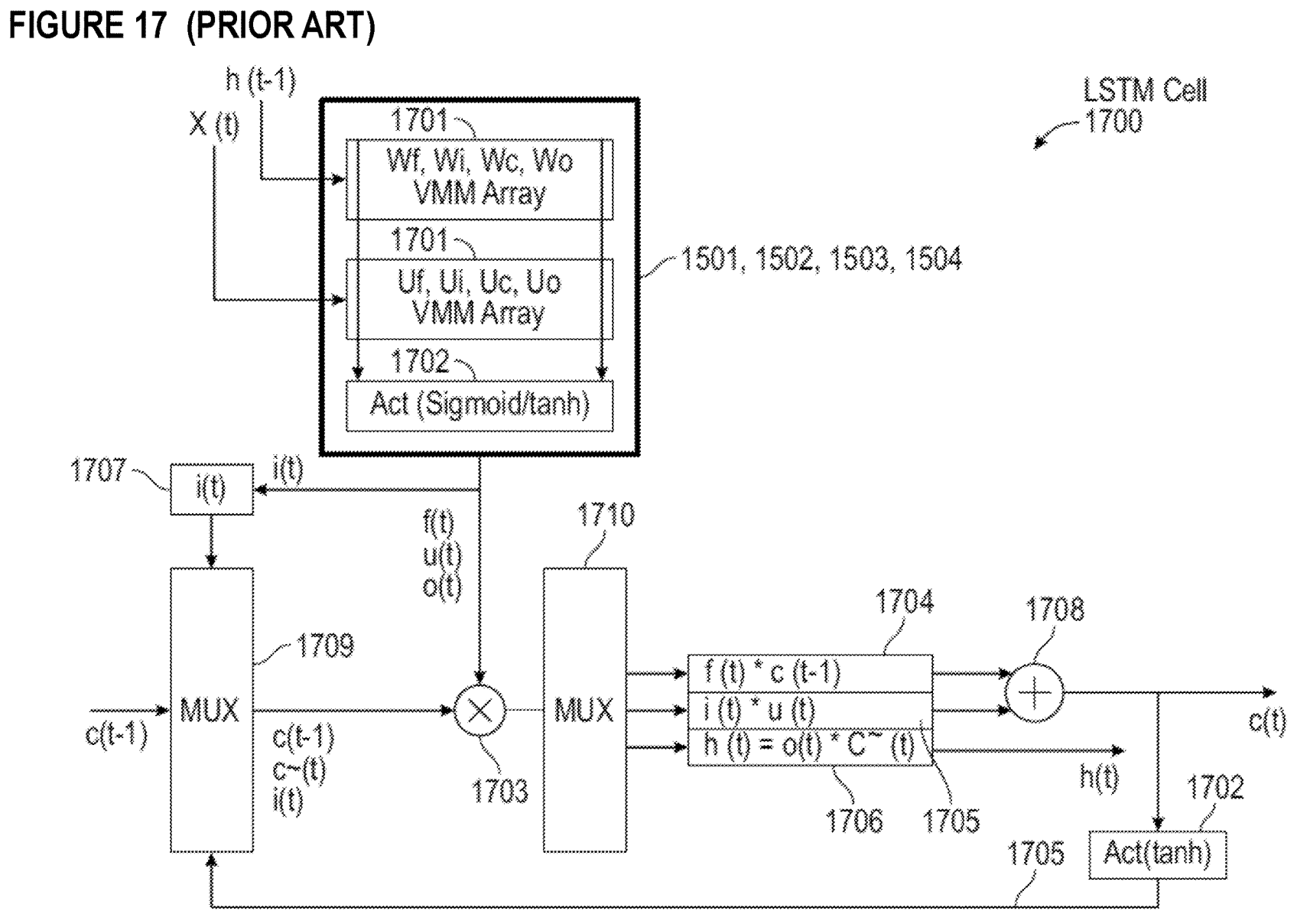

FIG. 17 depicts another embodiment of the exemplary cell of FIG. 15.

FIG. 26 depicts another embodiment of a vector-by-matrix multiplication system.

FIGS. 35A, 35B, 35C, 35D, 35E, and 35F depict embodiments of an output block.

FIGS. 37A and 37B depicts another embodiment of an output block.

FIG. 42 depicts an offset calibration method.

FIG. 43 depicts another offset calibration method.

DETAILED DESCRIPTION OF THE INVENTION

The artificial neural networks of the present invention utilize a combination of CMOS technology and non-volatile memory arrays.

VMM System Overview

Figure 1:
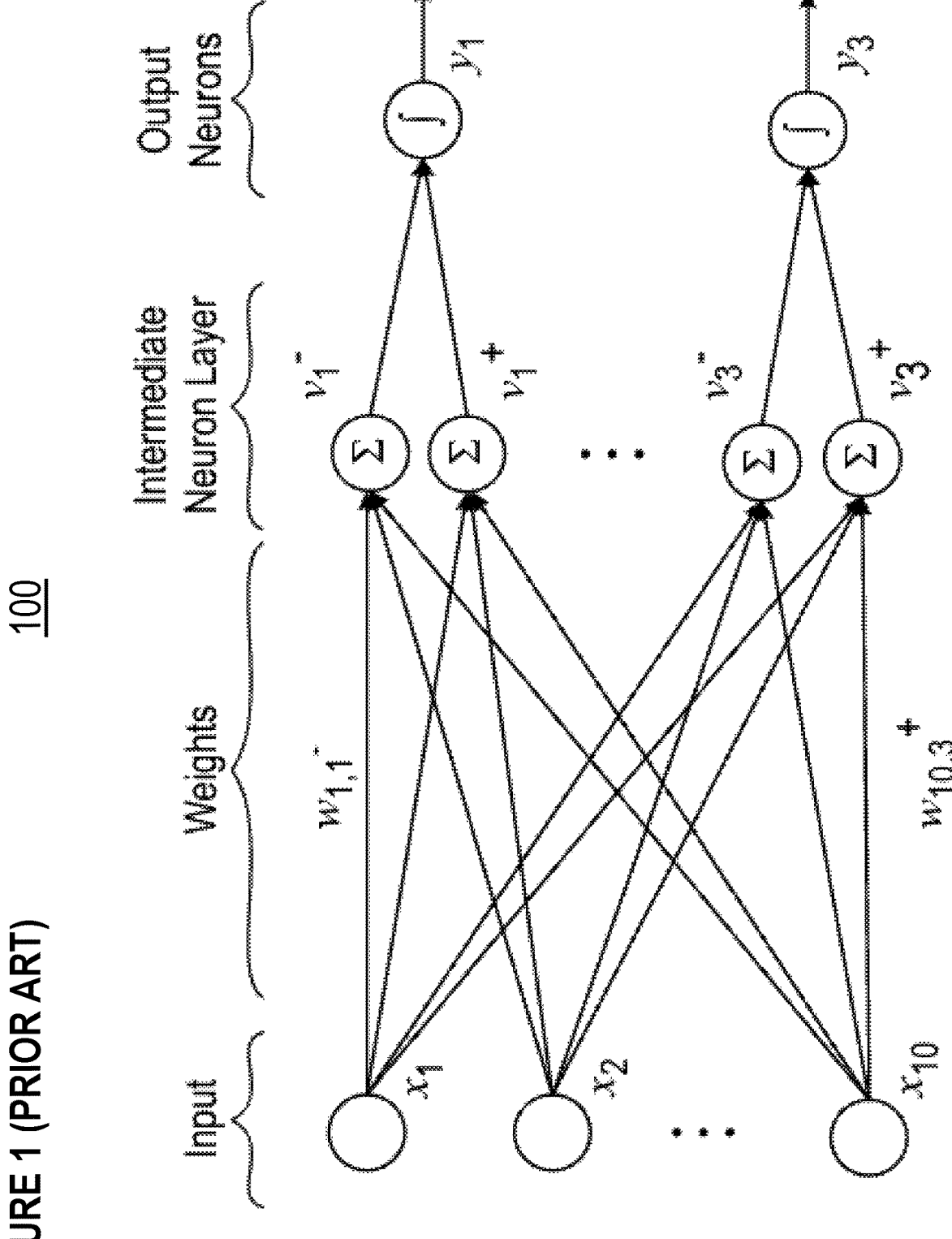
FIG. 1 is a diagram that illustrates an artificial neural network.
Figure 2:
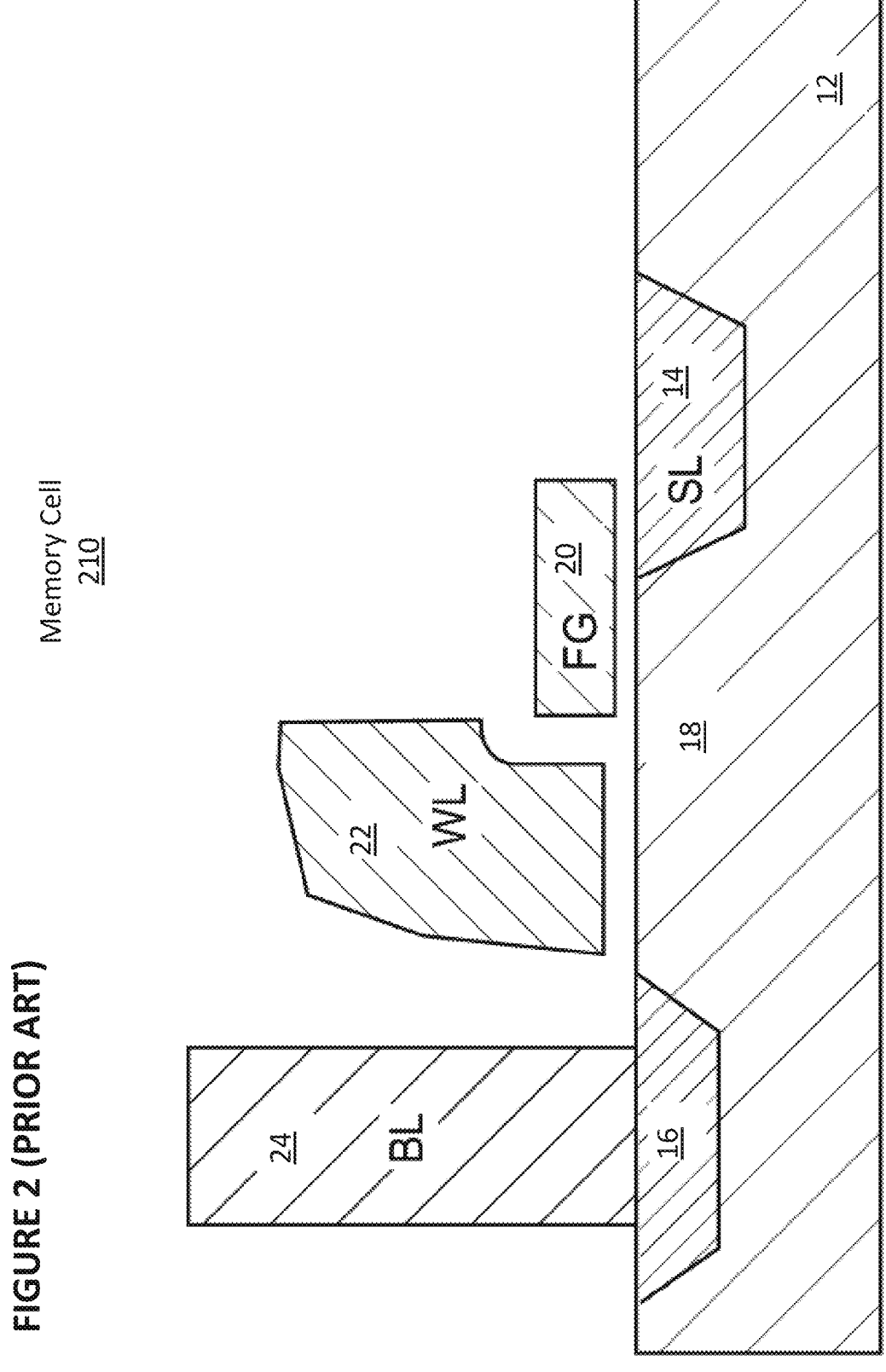
FIG. 2 depicts a prior art split gate flash memory cell.
Figure 4:
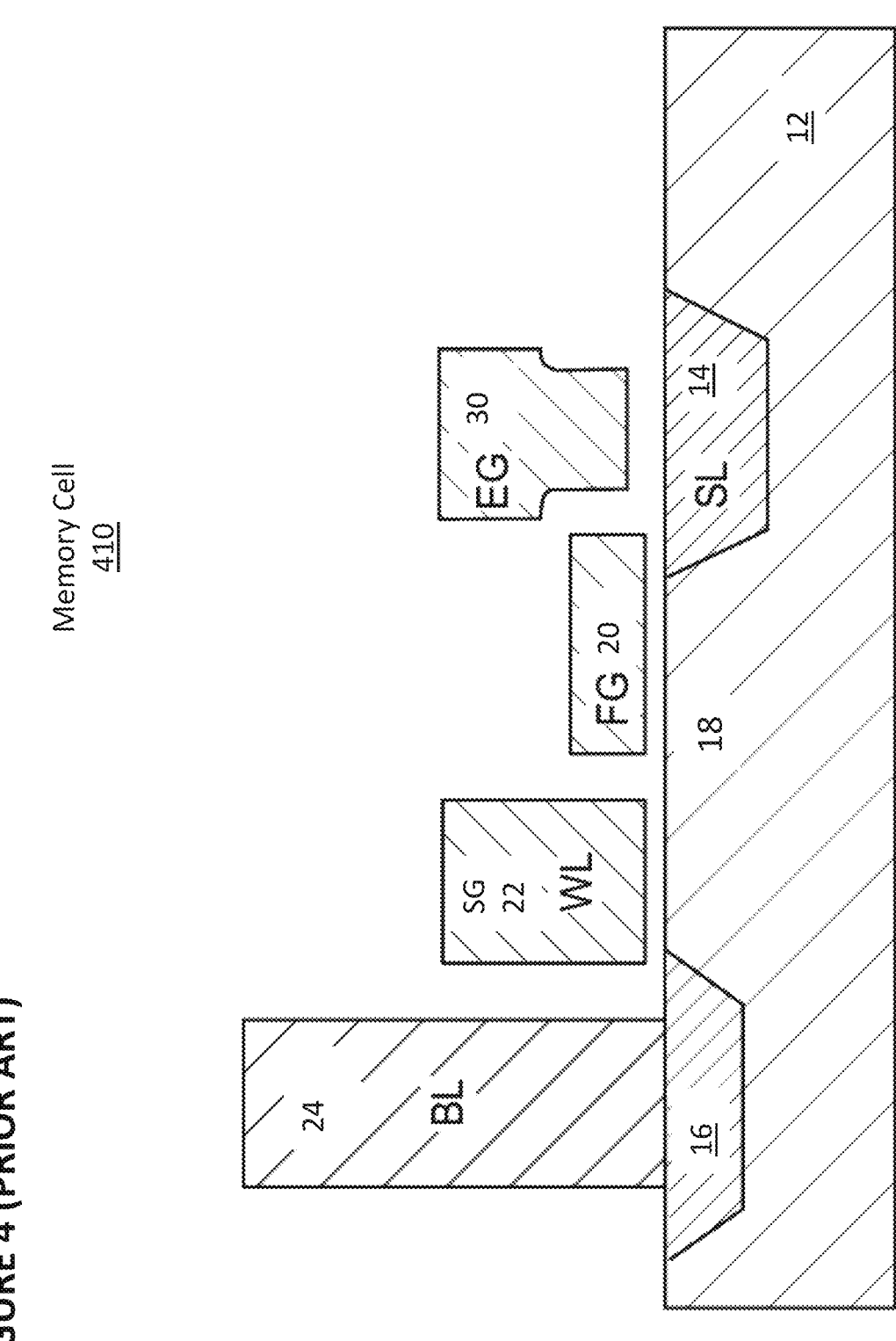
FIG. 4 depicts another prior art split gate flash memory cell.
Figure 5:
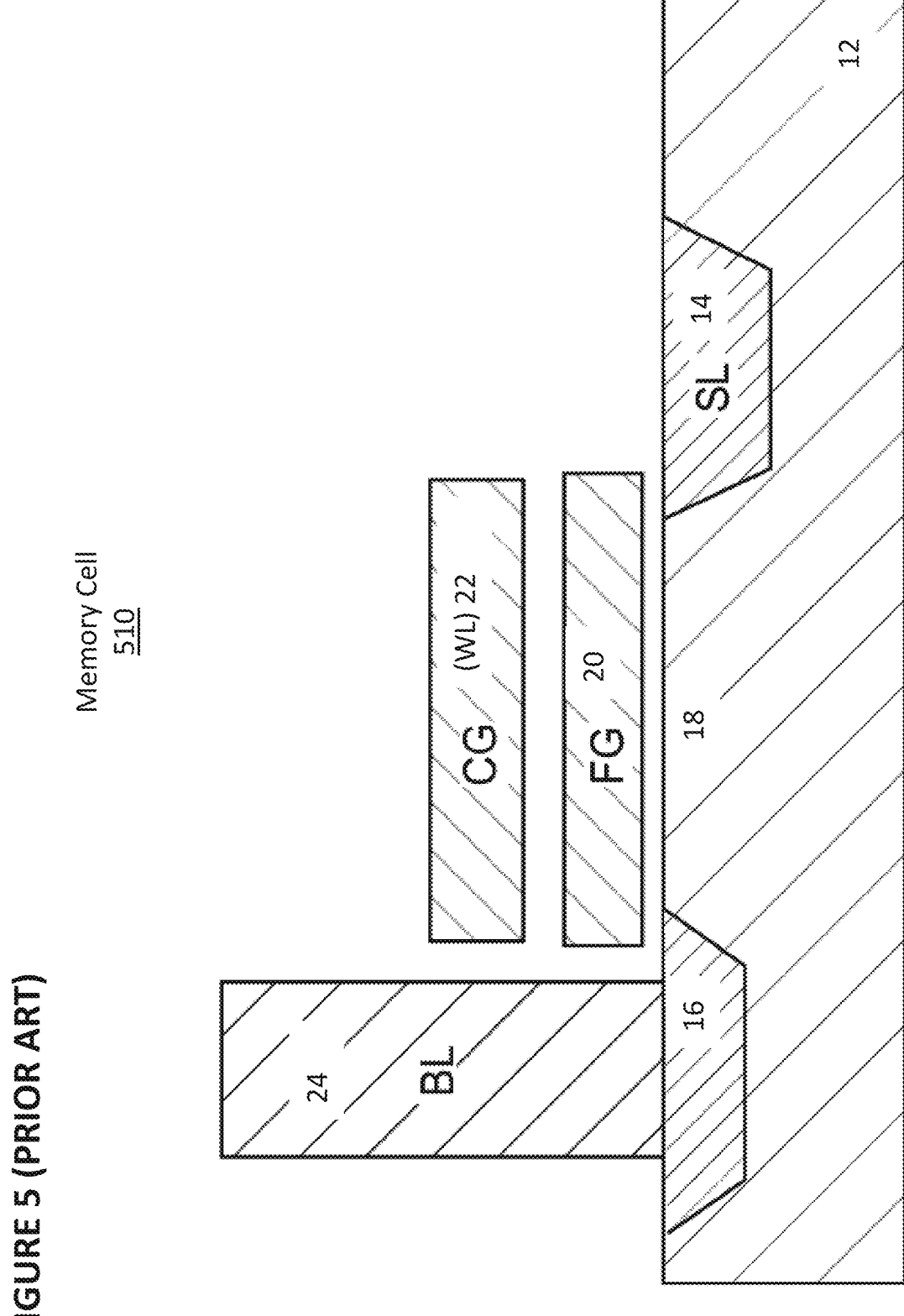
FIG. 5 depicts another prior art split gate flash memory cell.
Figure 6:
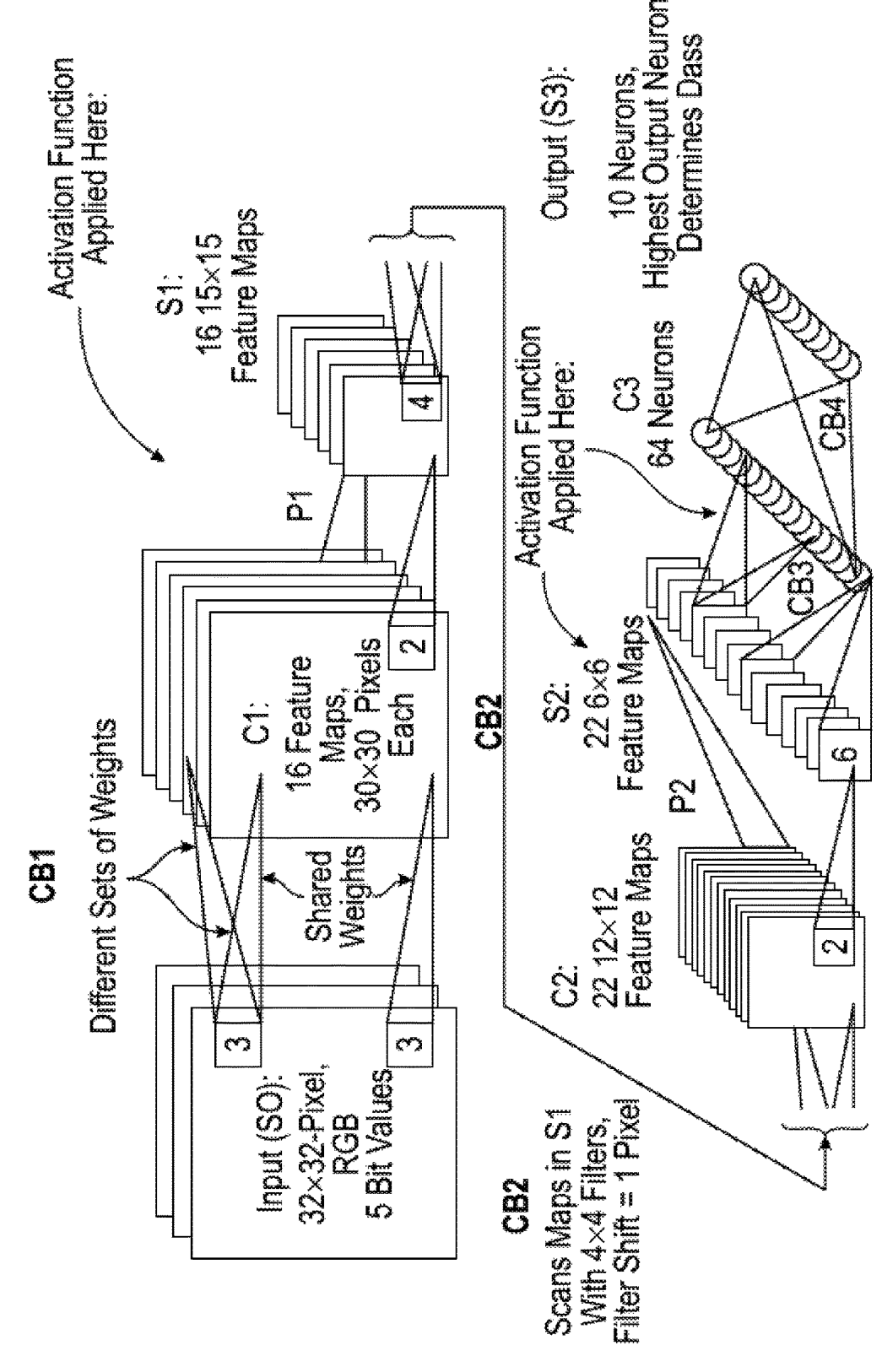
FIG. 6 is a diagram illustrating the different levels of an exemplary artificial neural network utilizing one or more non-volatile memory arrays.
Figure 7:
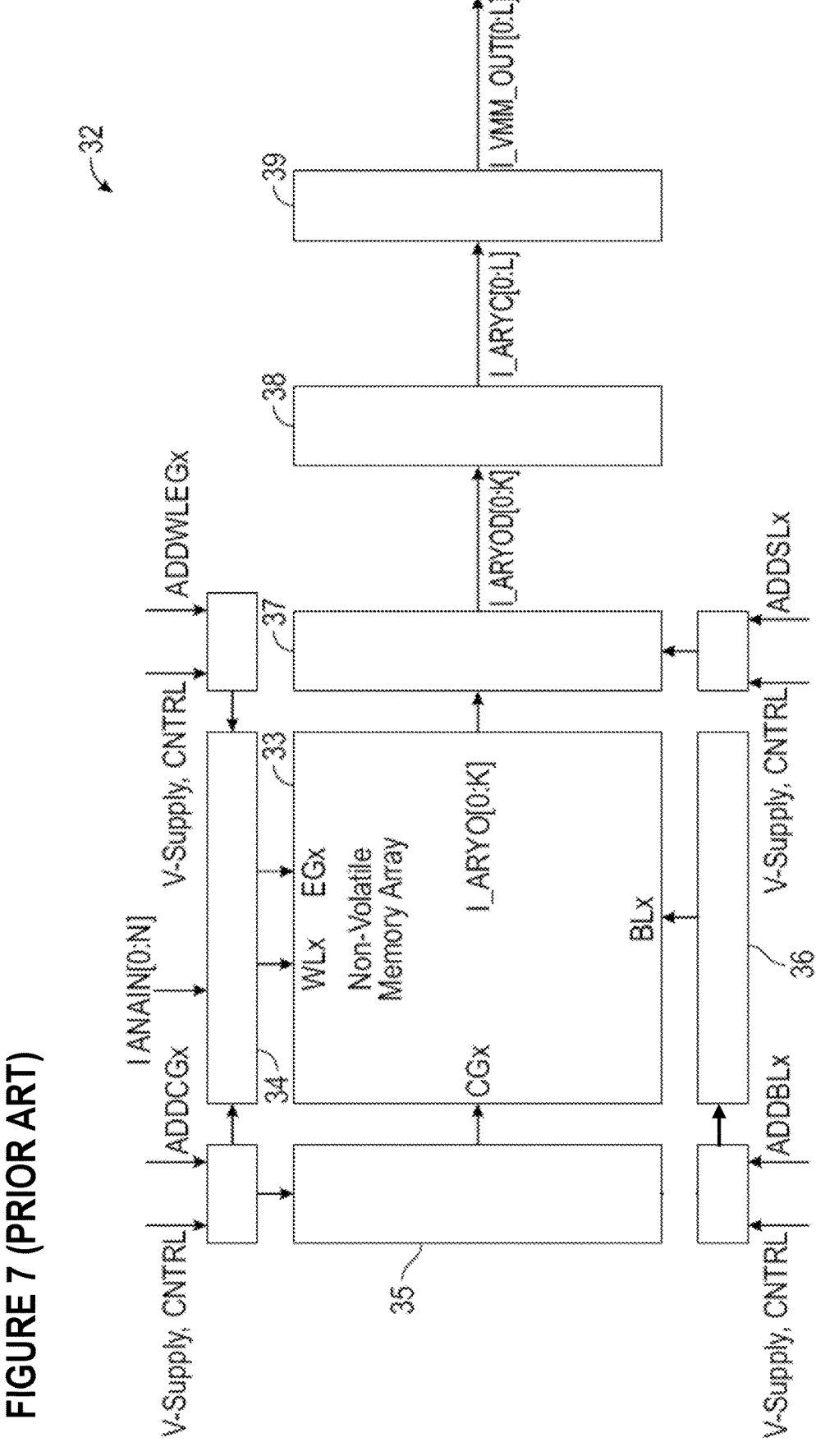
FIG. 7 is a block diagram illustrating a vector-by-matrix multiplication system.
Figure 8:
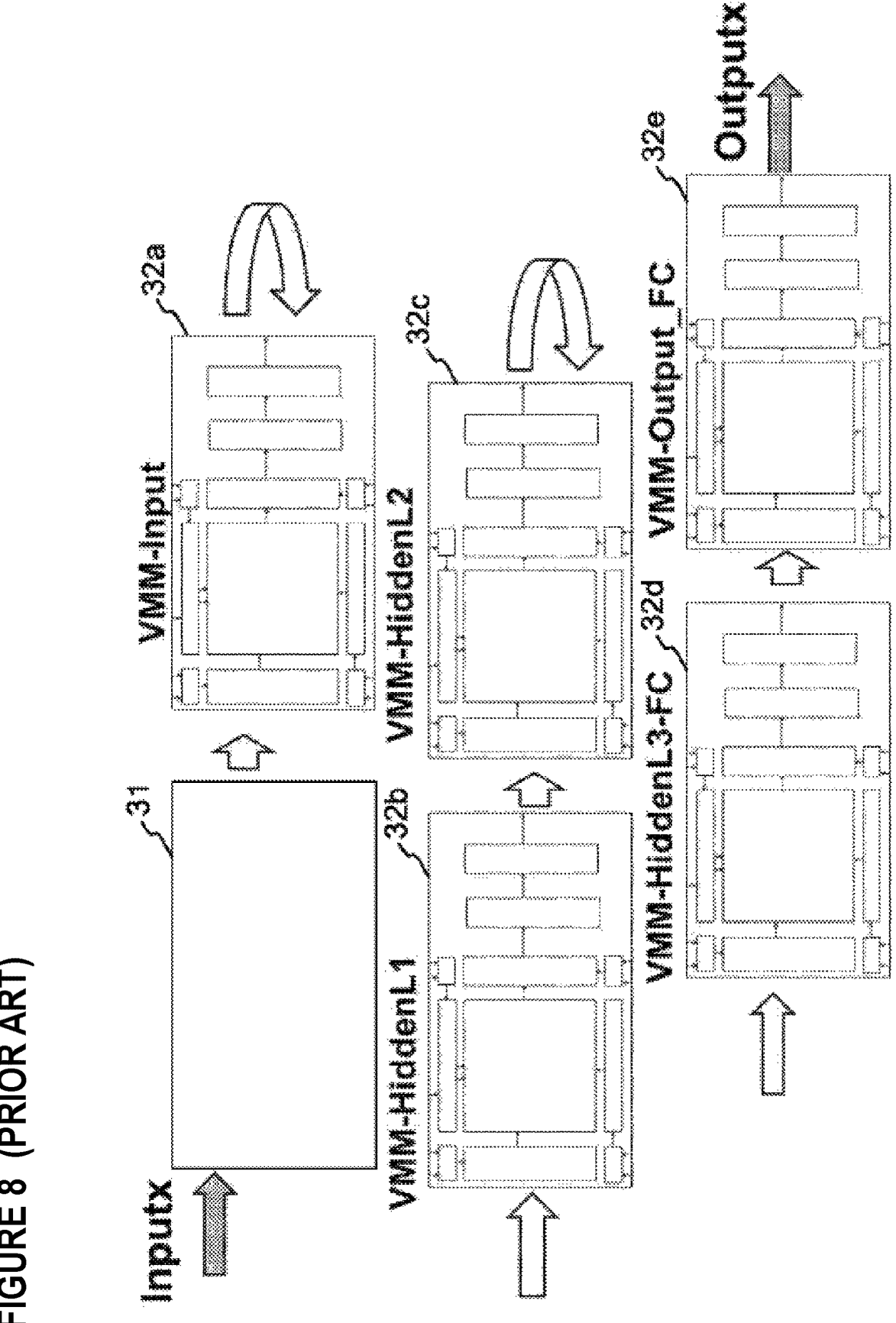
FIG. 8 is a block diagram illustrates an exemplary artificial neural network utilizing one or more vector-by-matrix multiplication systems.
Figure 9:
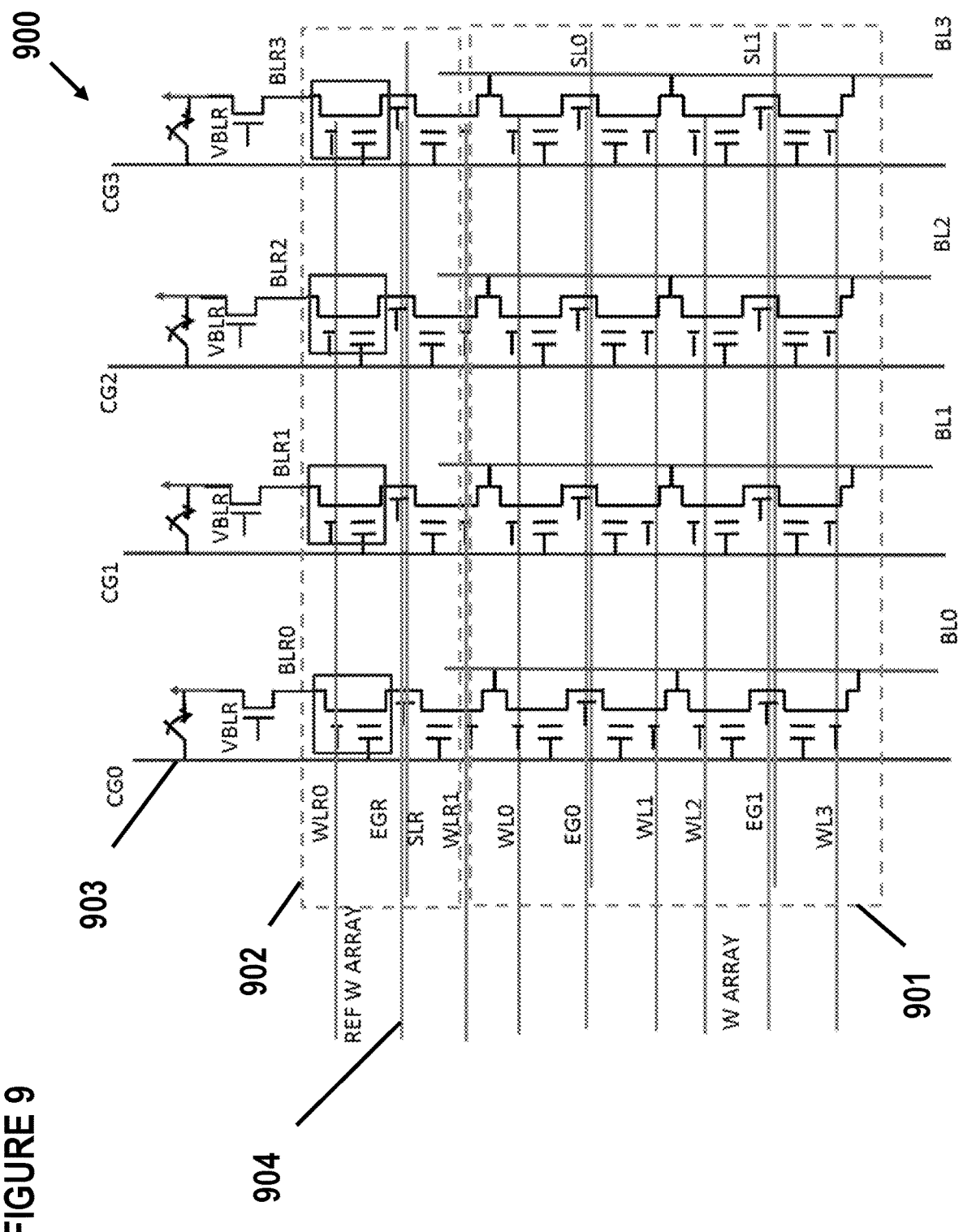
FIG. 9 depicts another embodiment of a vector-by-matrix multiplication system.
Figure 10:
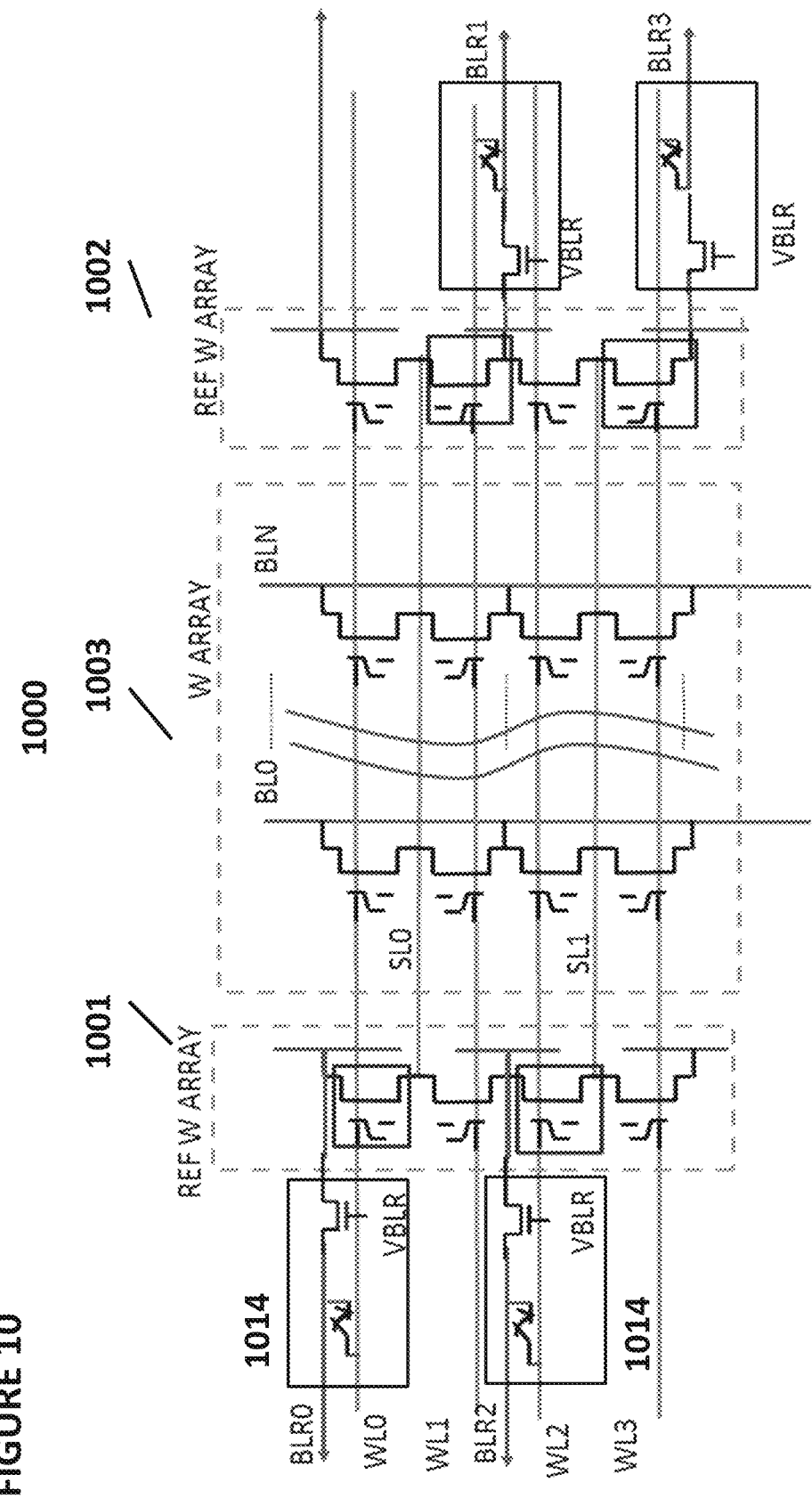
FIG. 10 depicts another embodiment of a vector-by-matrix multiplication system.
Figure 11:
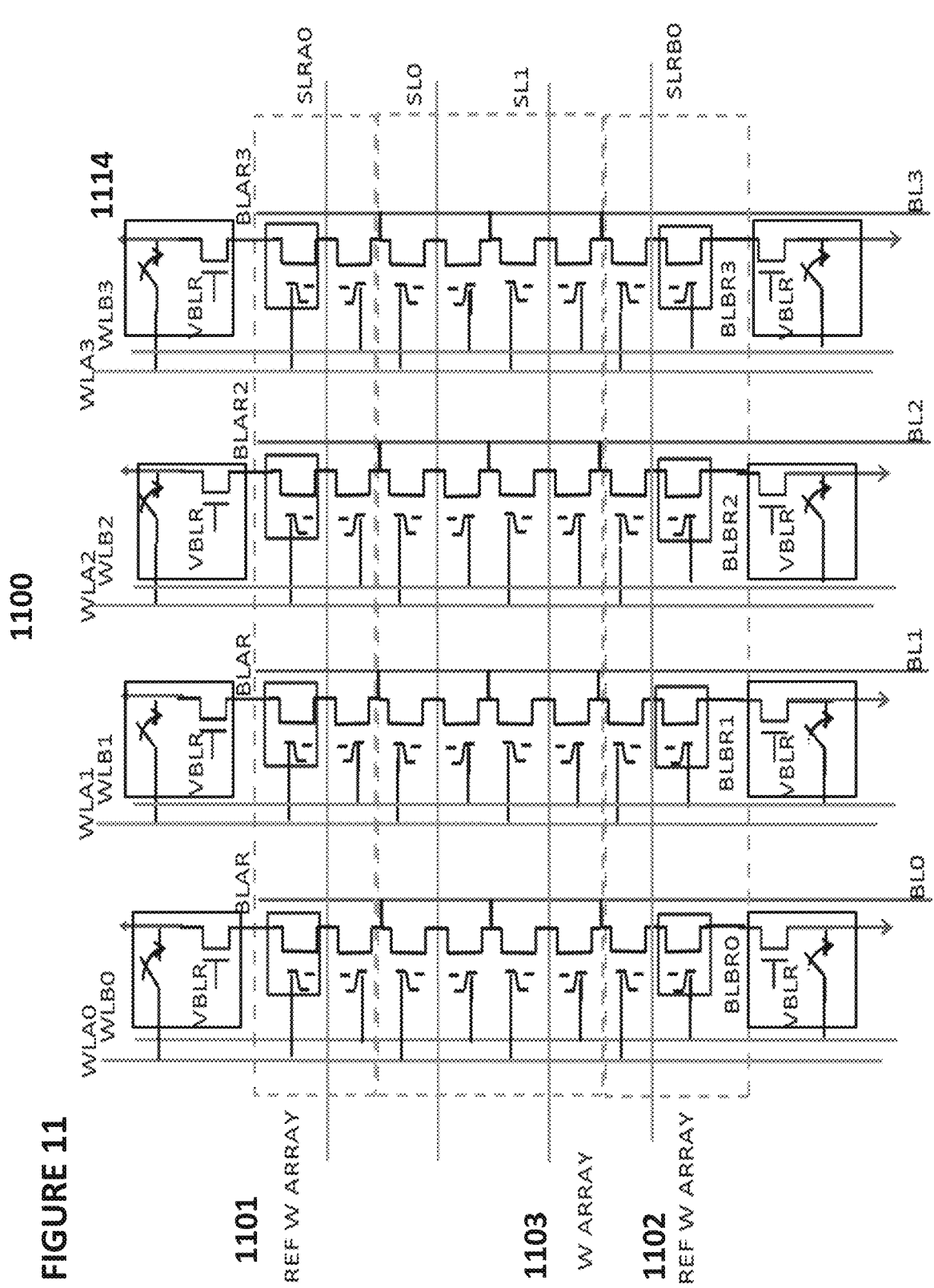
FIG. 11 depicts another embodiment of a vector-by-matrix multiplication system.
Figure 12:
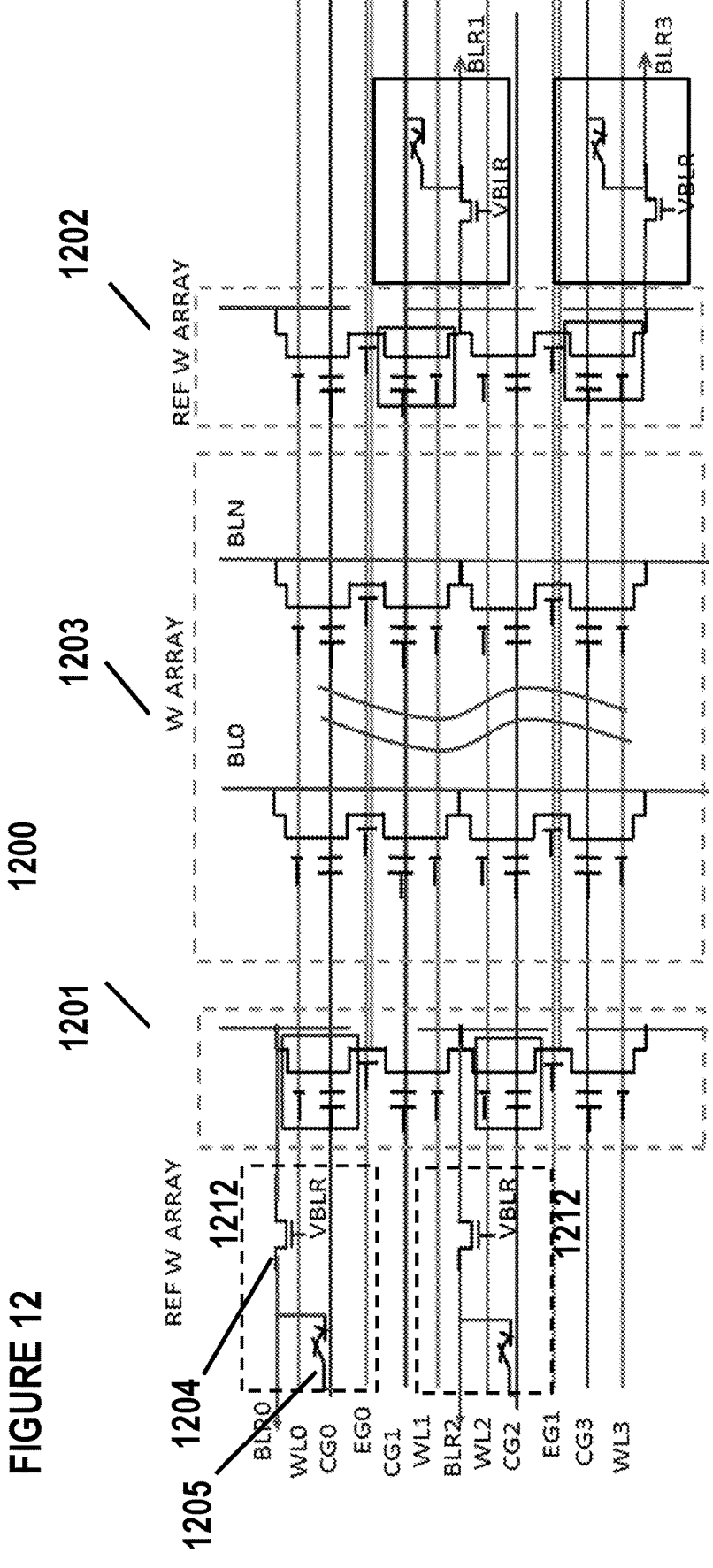
FIG. 12 depicts another embodiment of a vector-by-matrix multiplication system.
Figure 13:
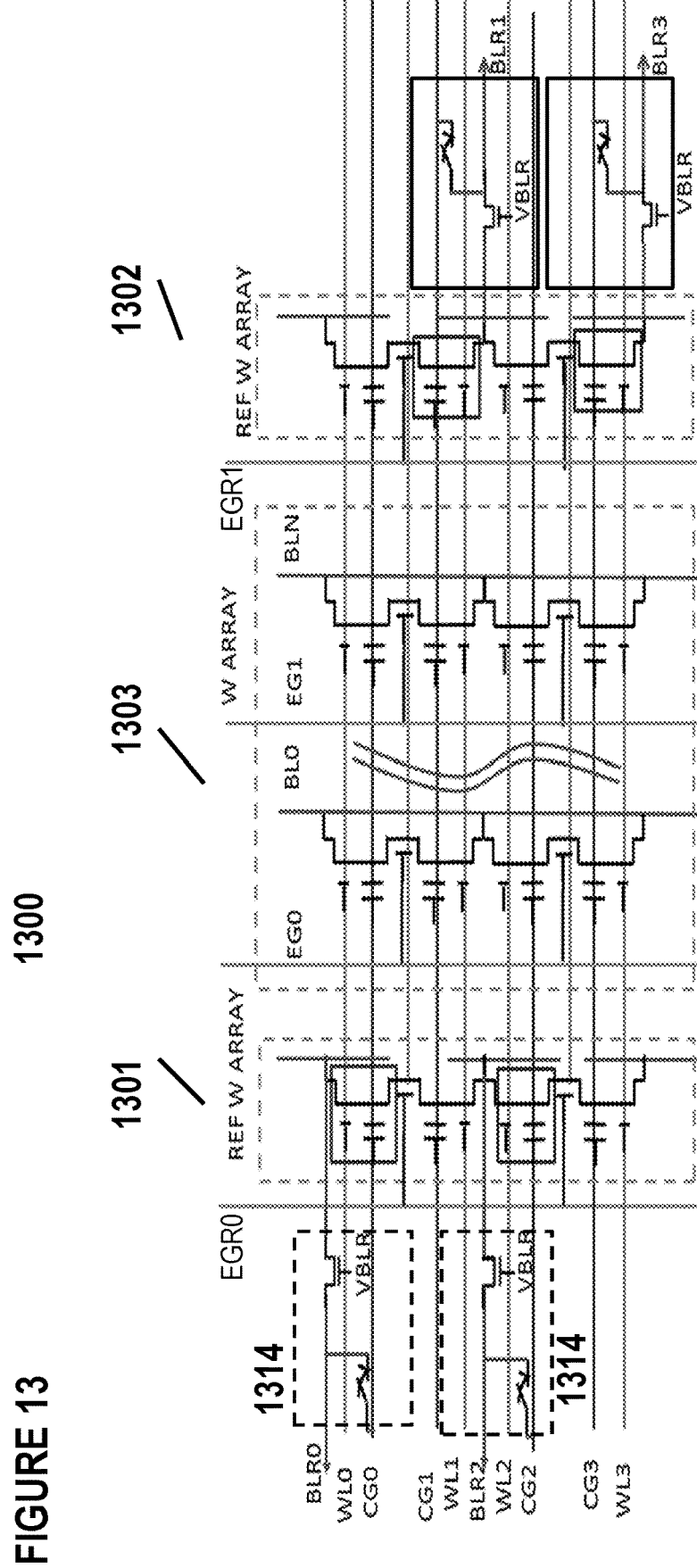
FIG. 13 depicts another embodiment of a vector-by-matrix multiplication system.
Figure 14:
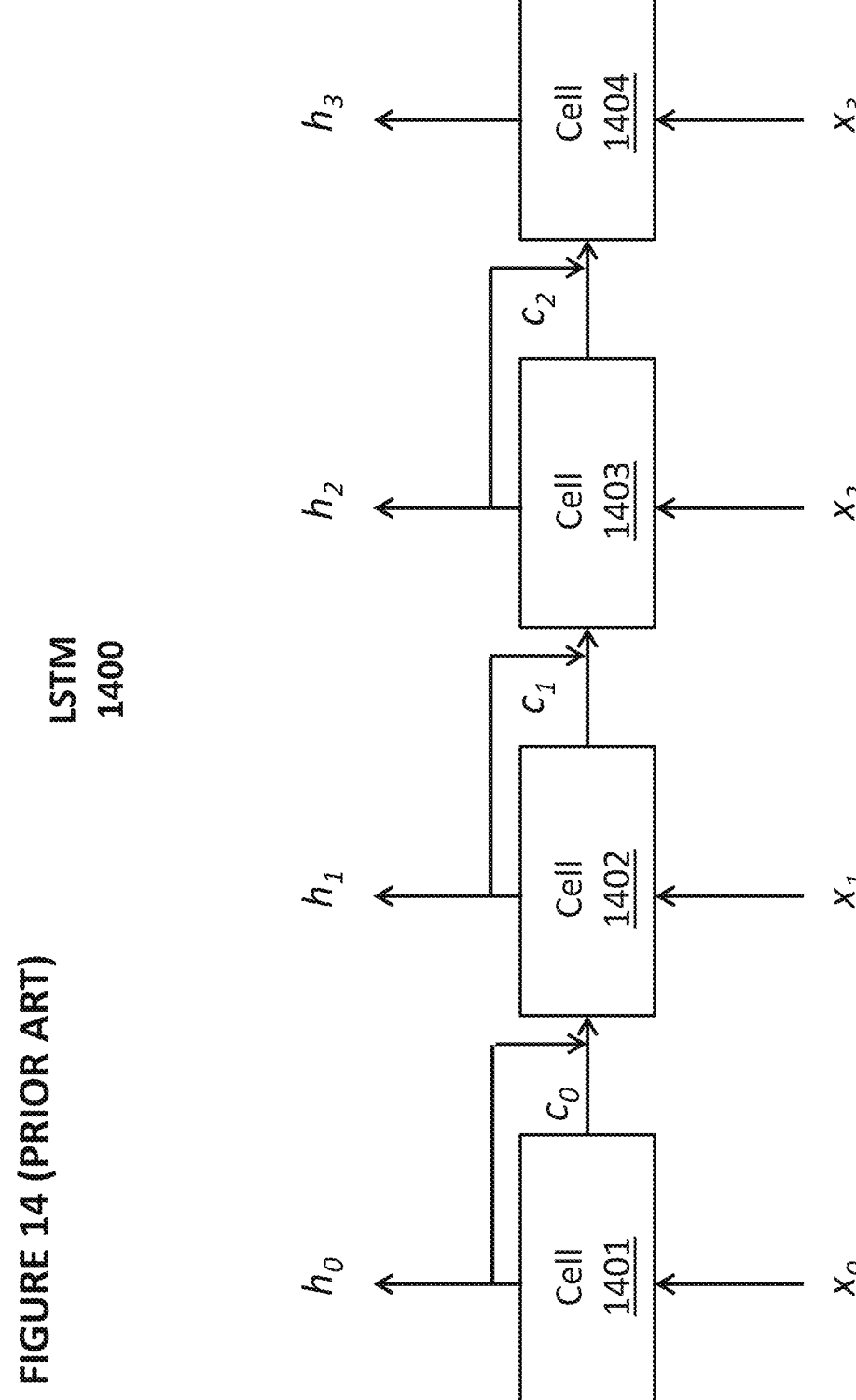
FIG. 14 depicts a prior art long short-term memory system.
Figure 15:
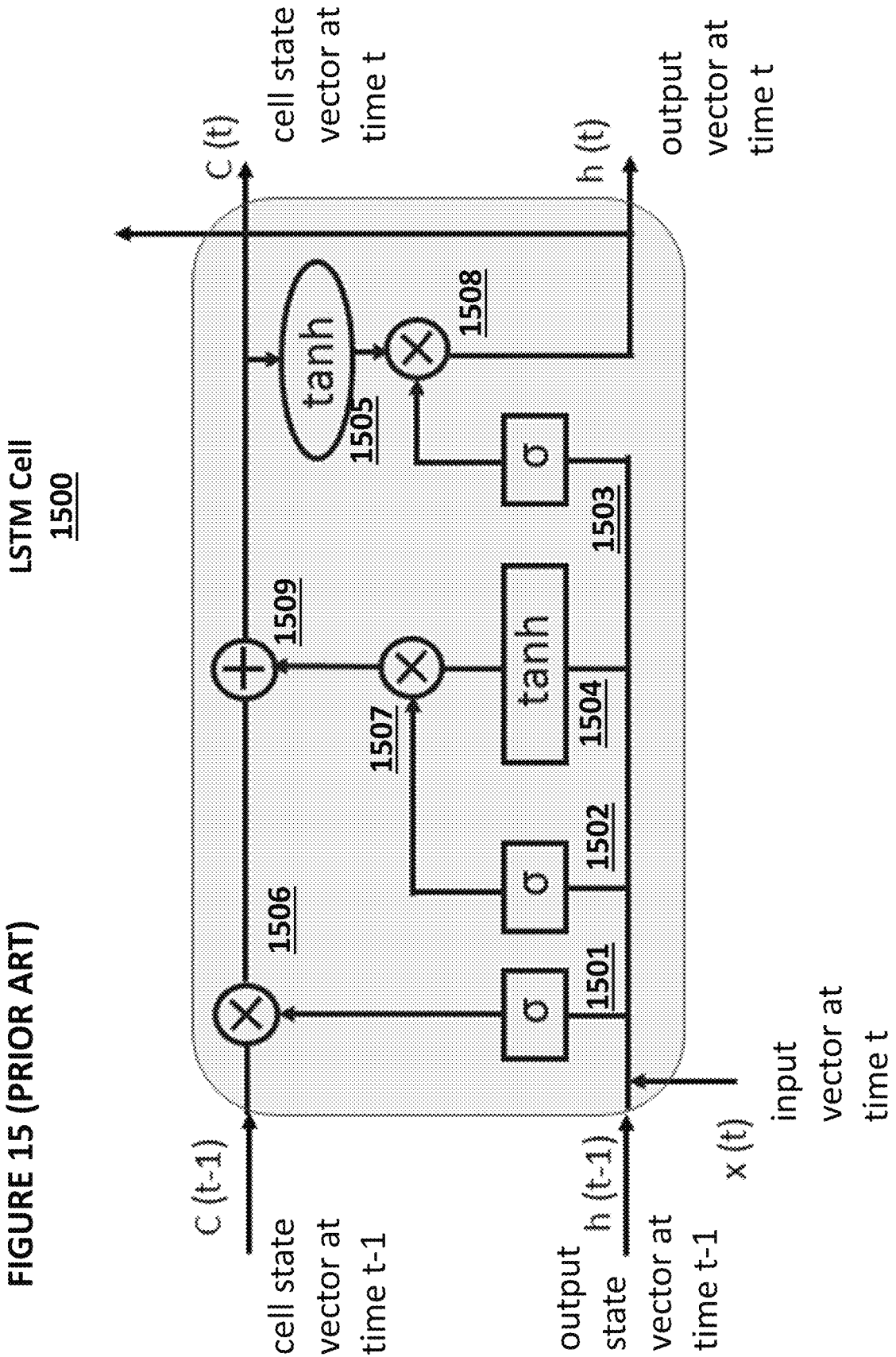
FIG. 15 depicts an exemplary cell for use in a long short-term memory system.
Figure 16:
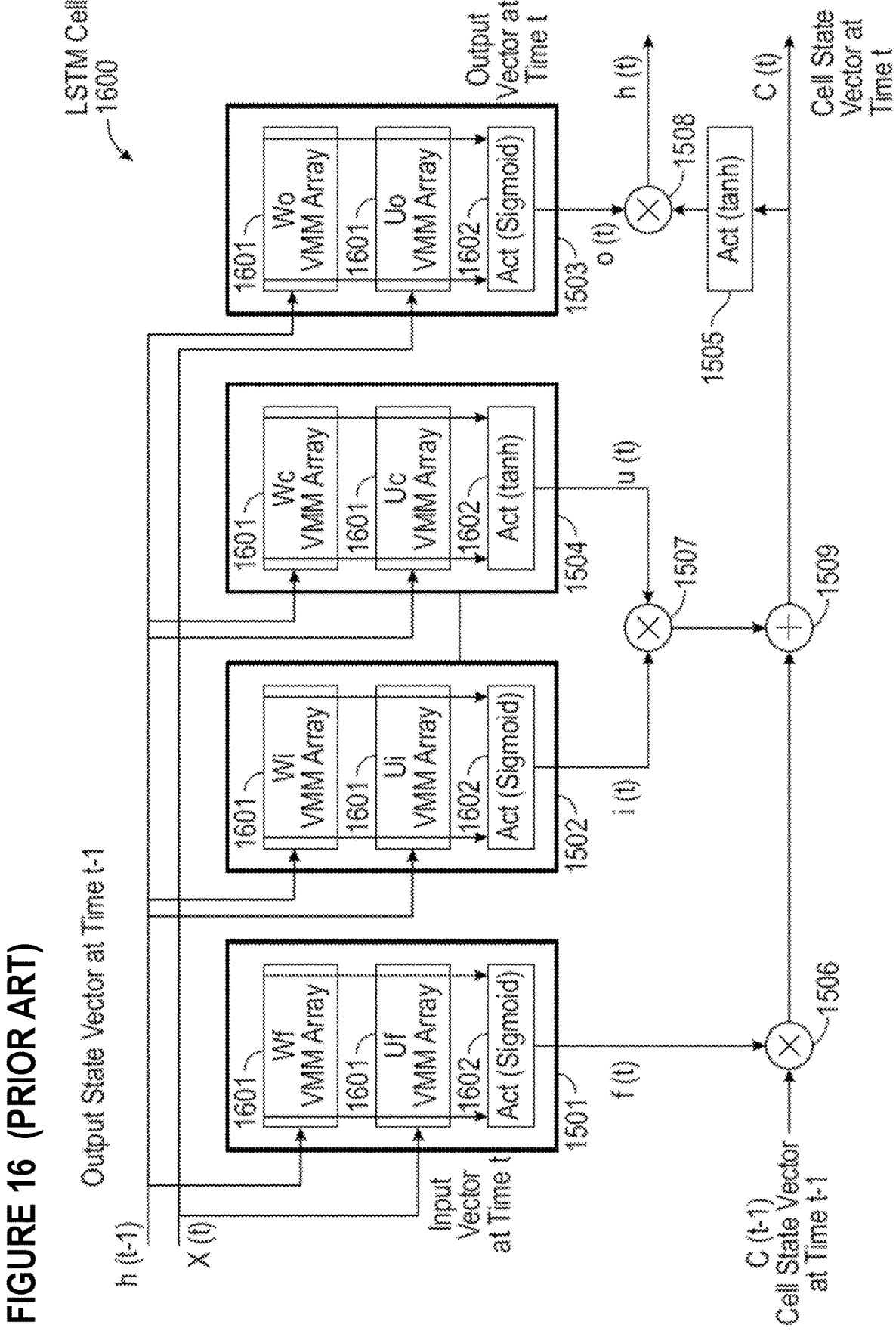
FIG. 16 depicts an embodiment of the exemplary cell of FIG. 15.
Figure 18:
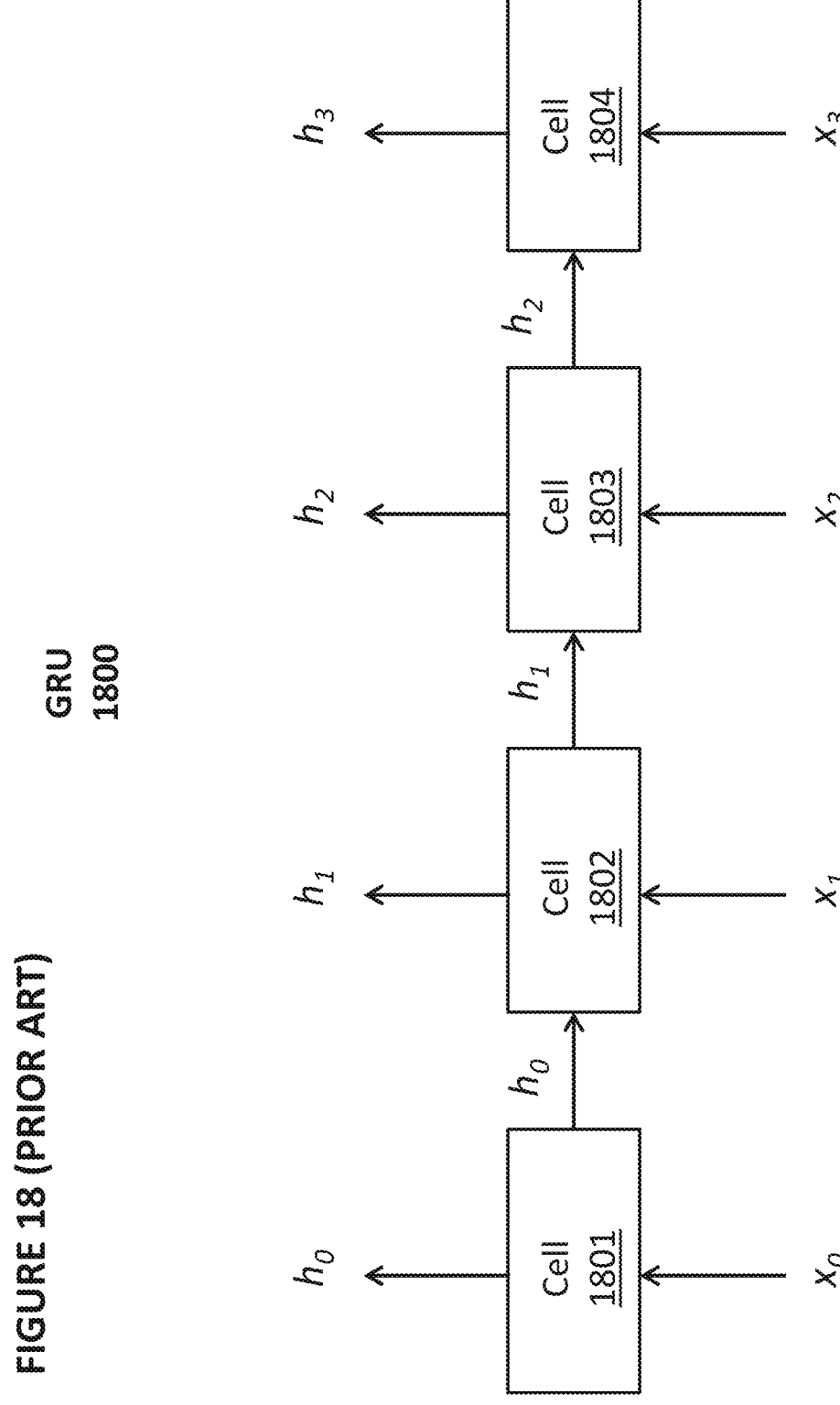
FIG. 18 depicts a prior art gated recurrent unit system.
Figure 19:
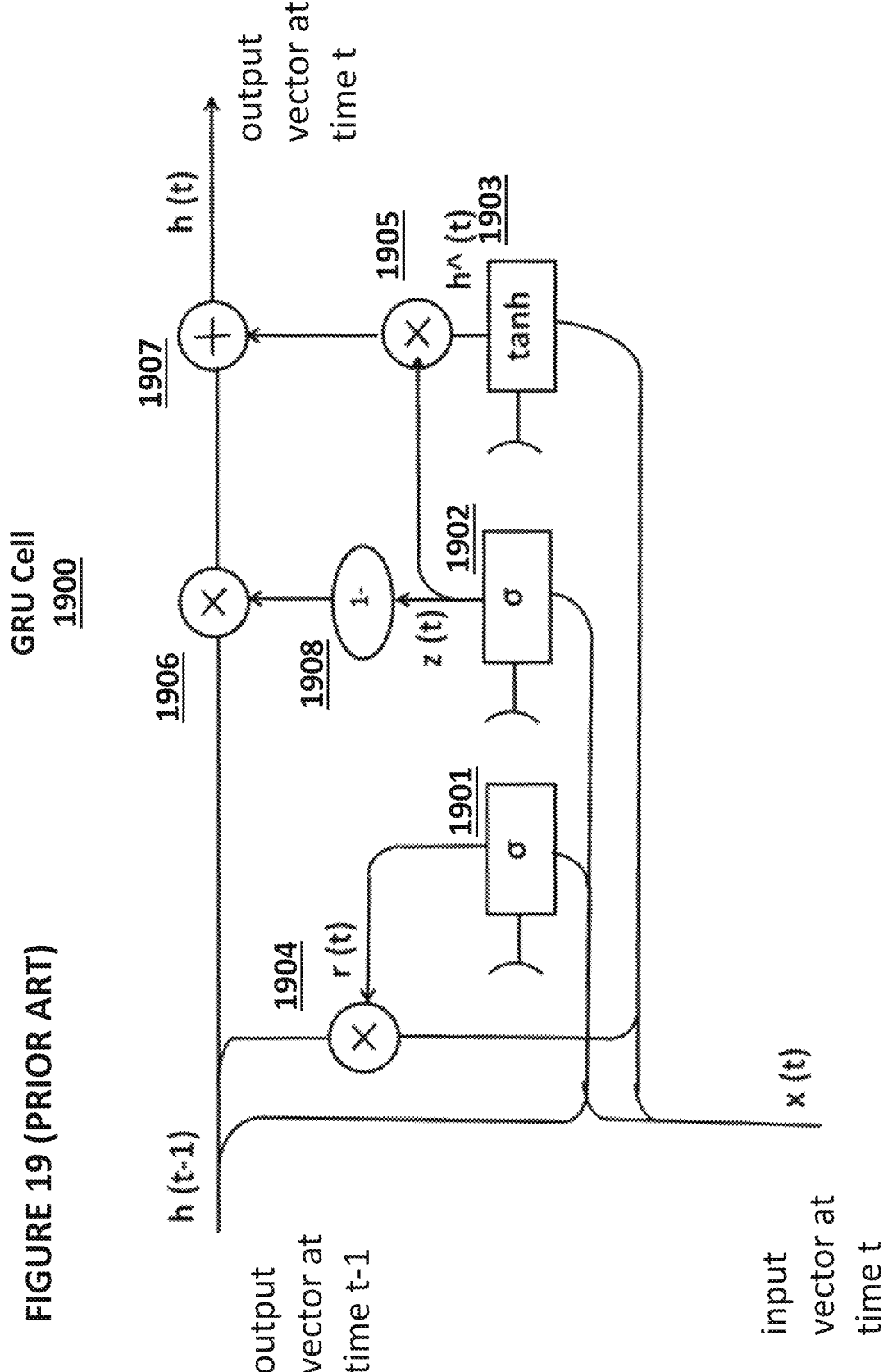
FIG. 19 depicts an exemplary cell for use in a gated recurrent unit system.
Figure 20:
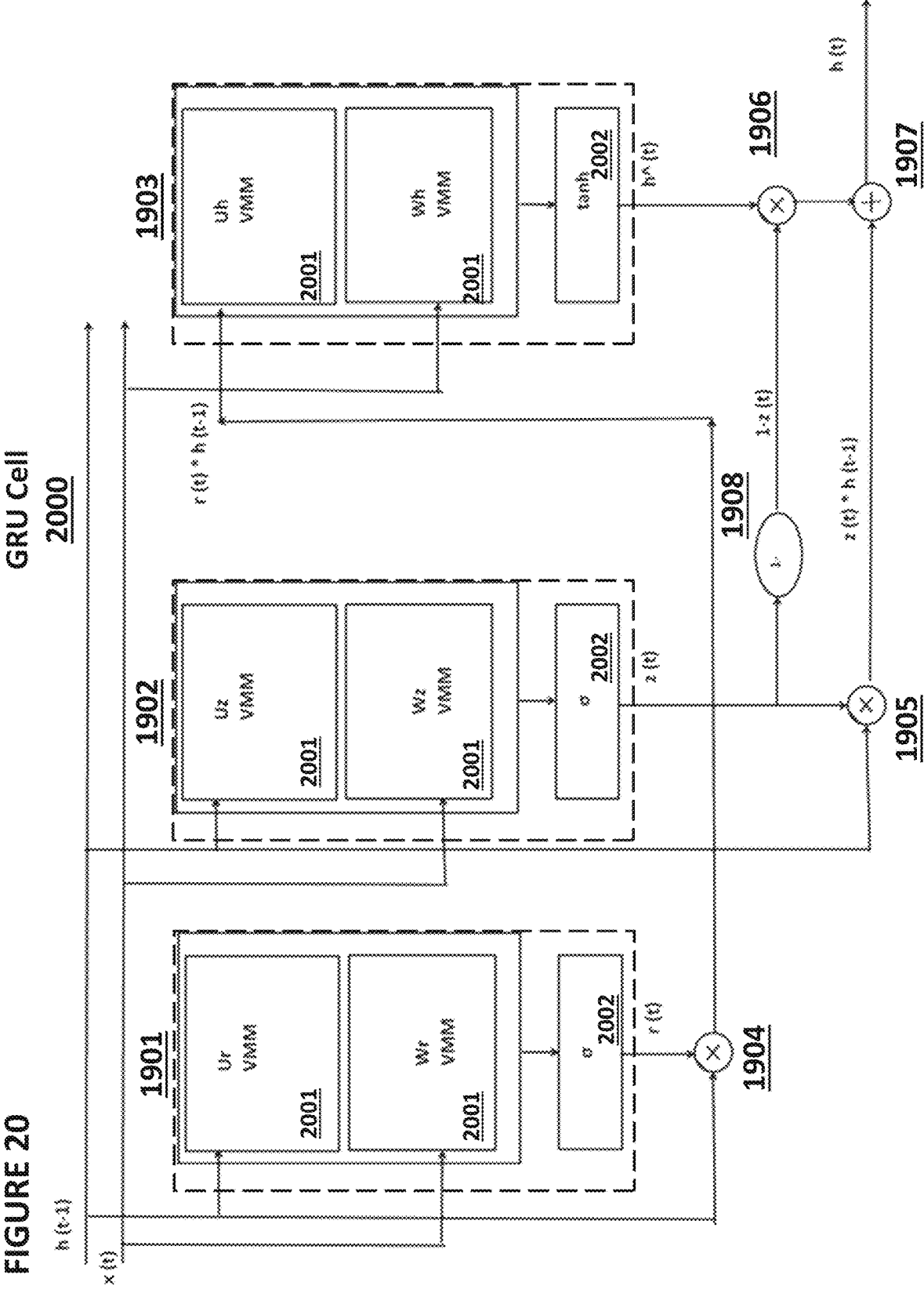
FIG. 20 depicts an embodiment of the exemplary cell of FIG. 19.
Figure 21:
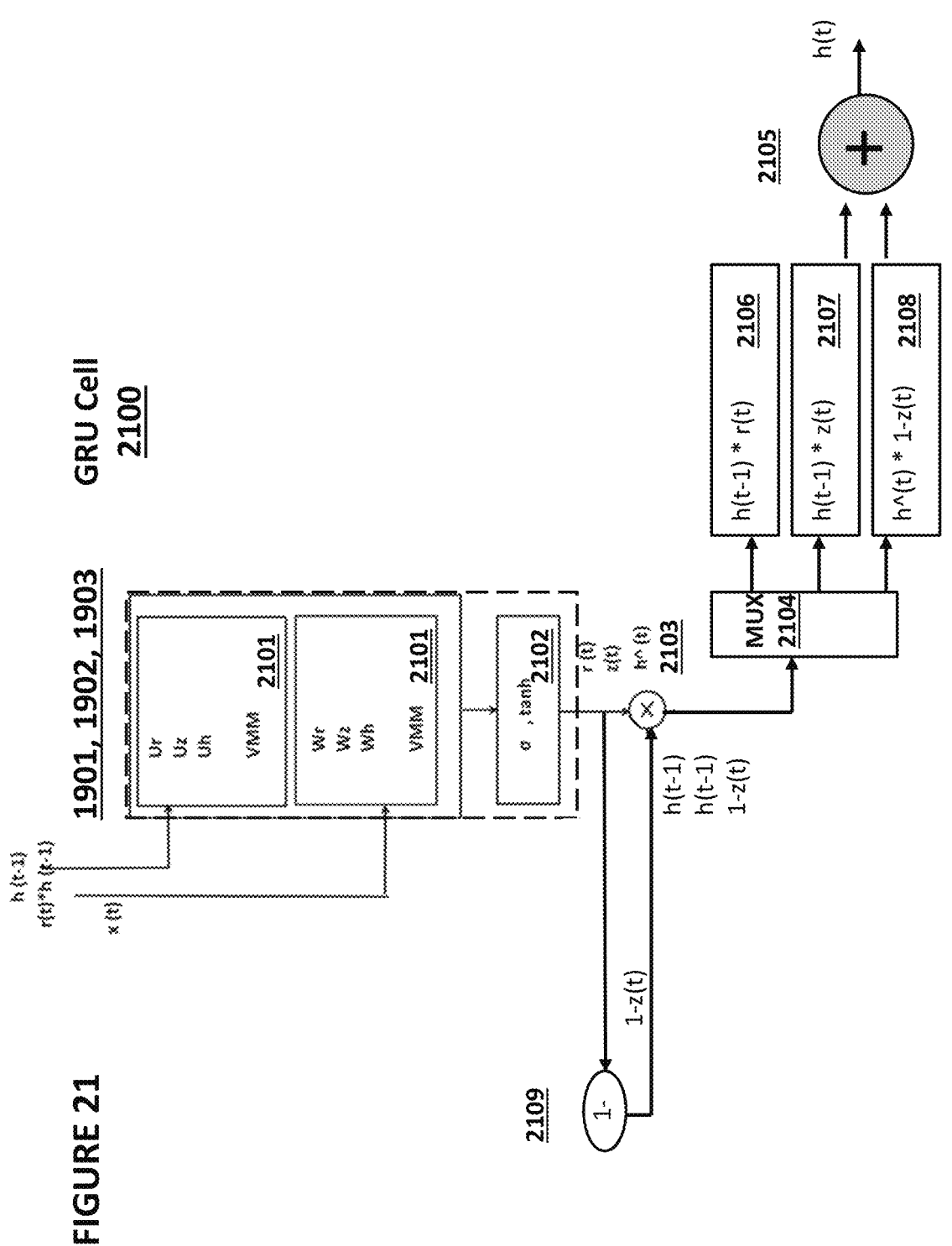
FIG. 21 depicts another embodiment of the exemplary cell of FIG. 19.
Figure 22:
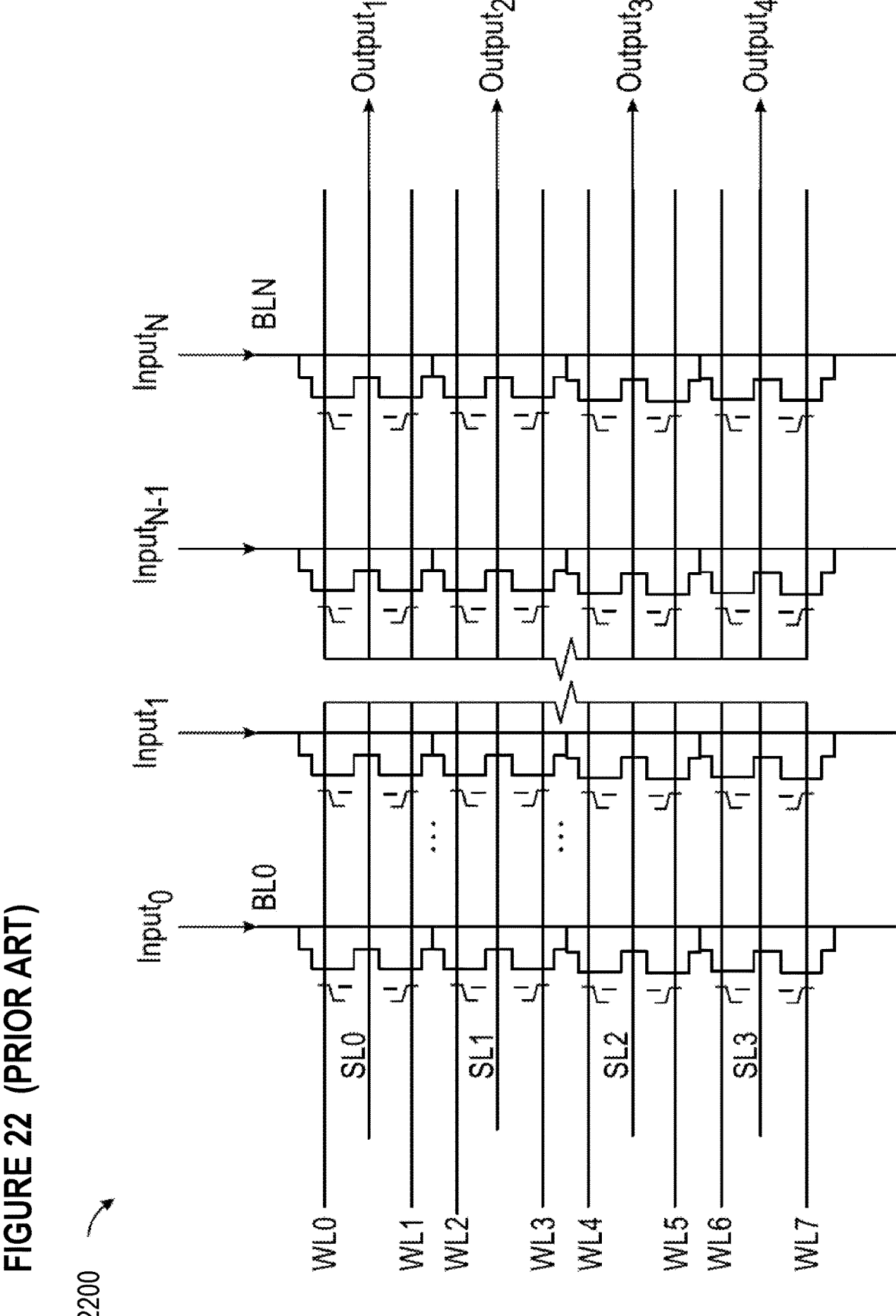
FIG. 22 depicts another embodiment of a vector-by-matrix multiplication system.
Figure 23:
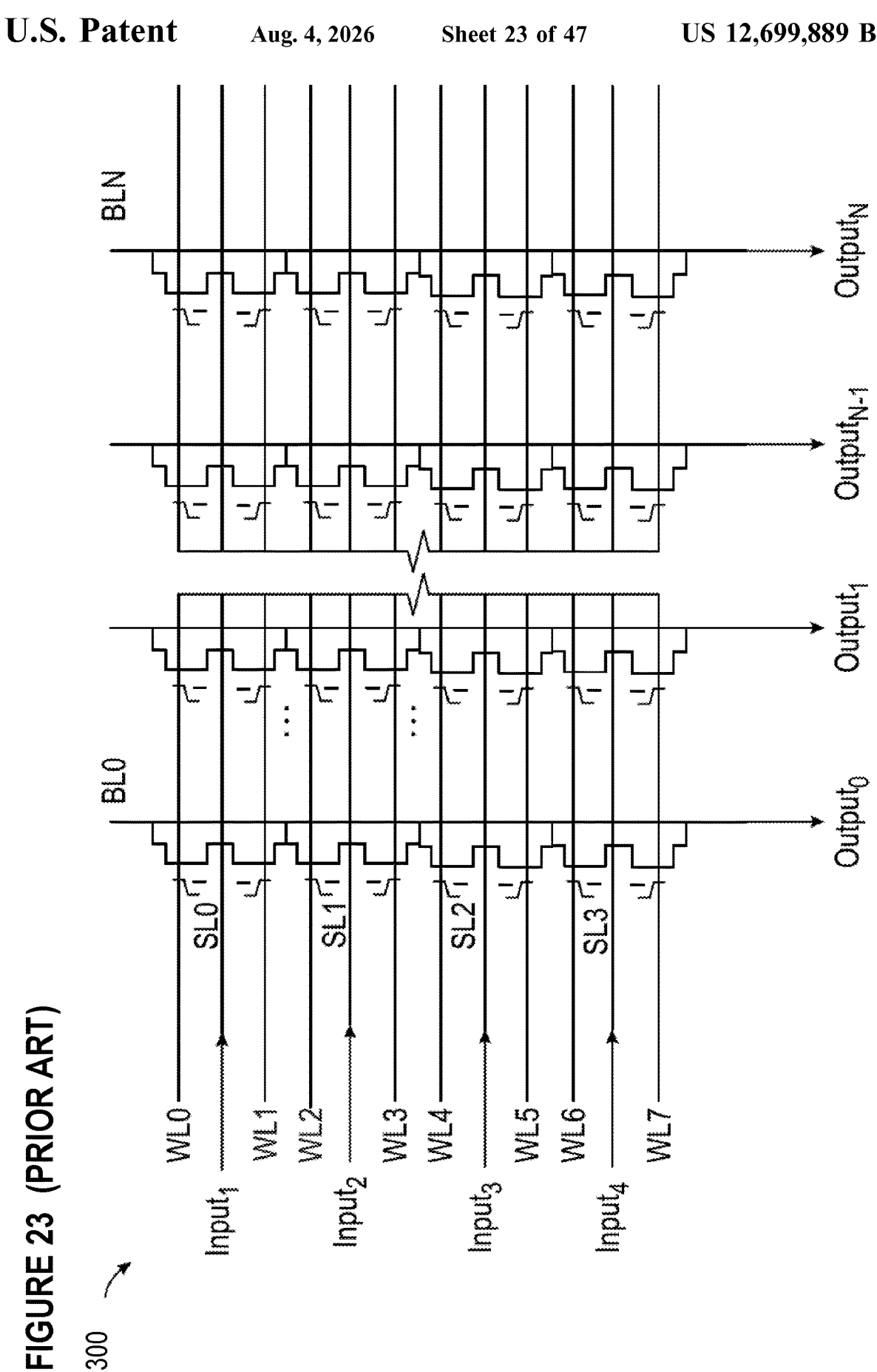
FIG. 23 depicts another embodiment of a vector-by-matrix multiplication system.
Figure 24:
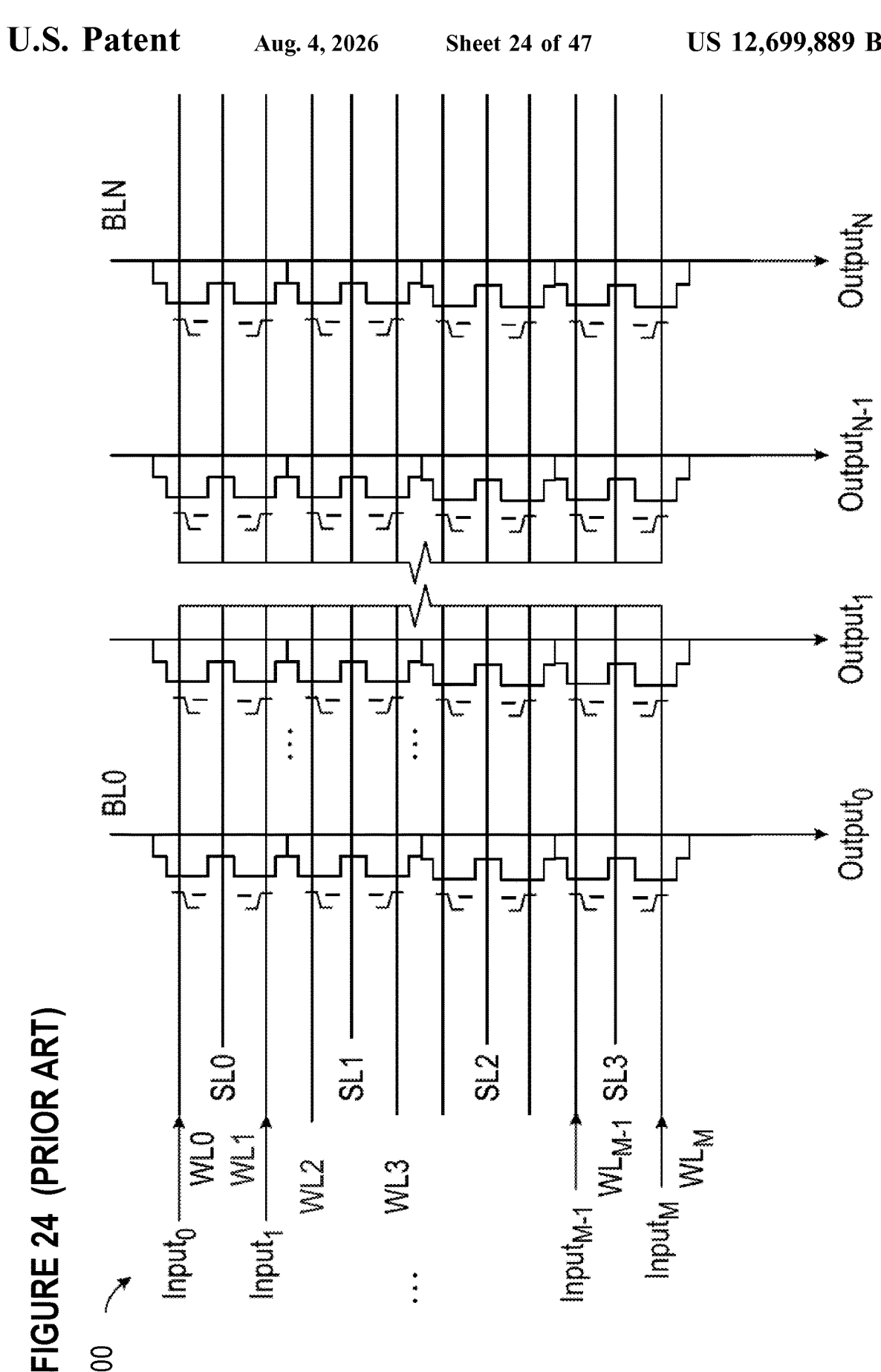
FIG. 24 depicts another embodiment of a vector-by-matrix multiplication system.
Figure 25:
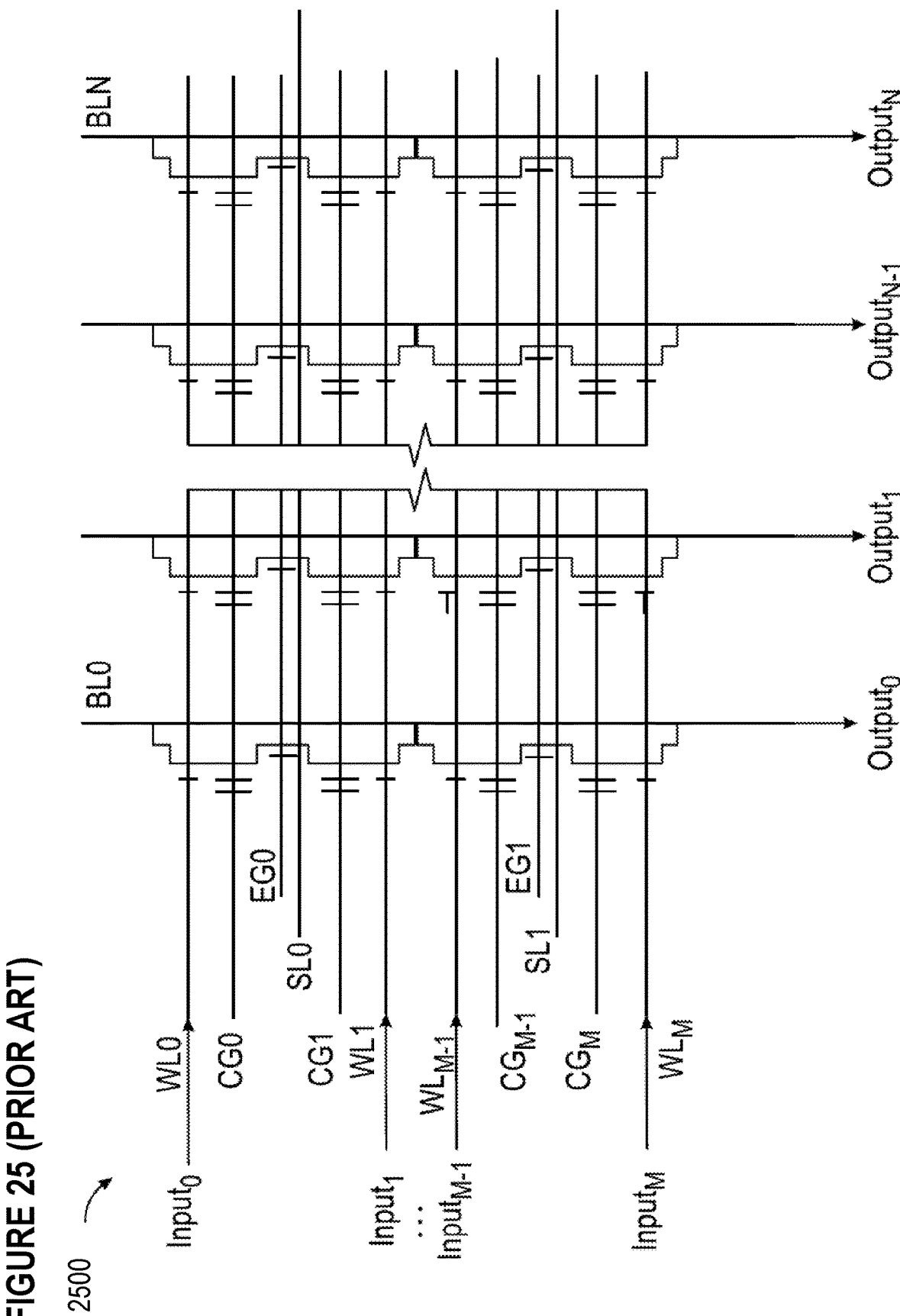
FIG. 25 depicts another embodiment of a vector-by-matrix multiplication system.
Figure 27:
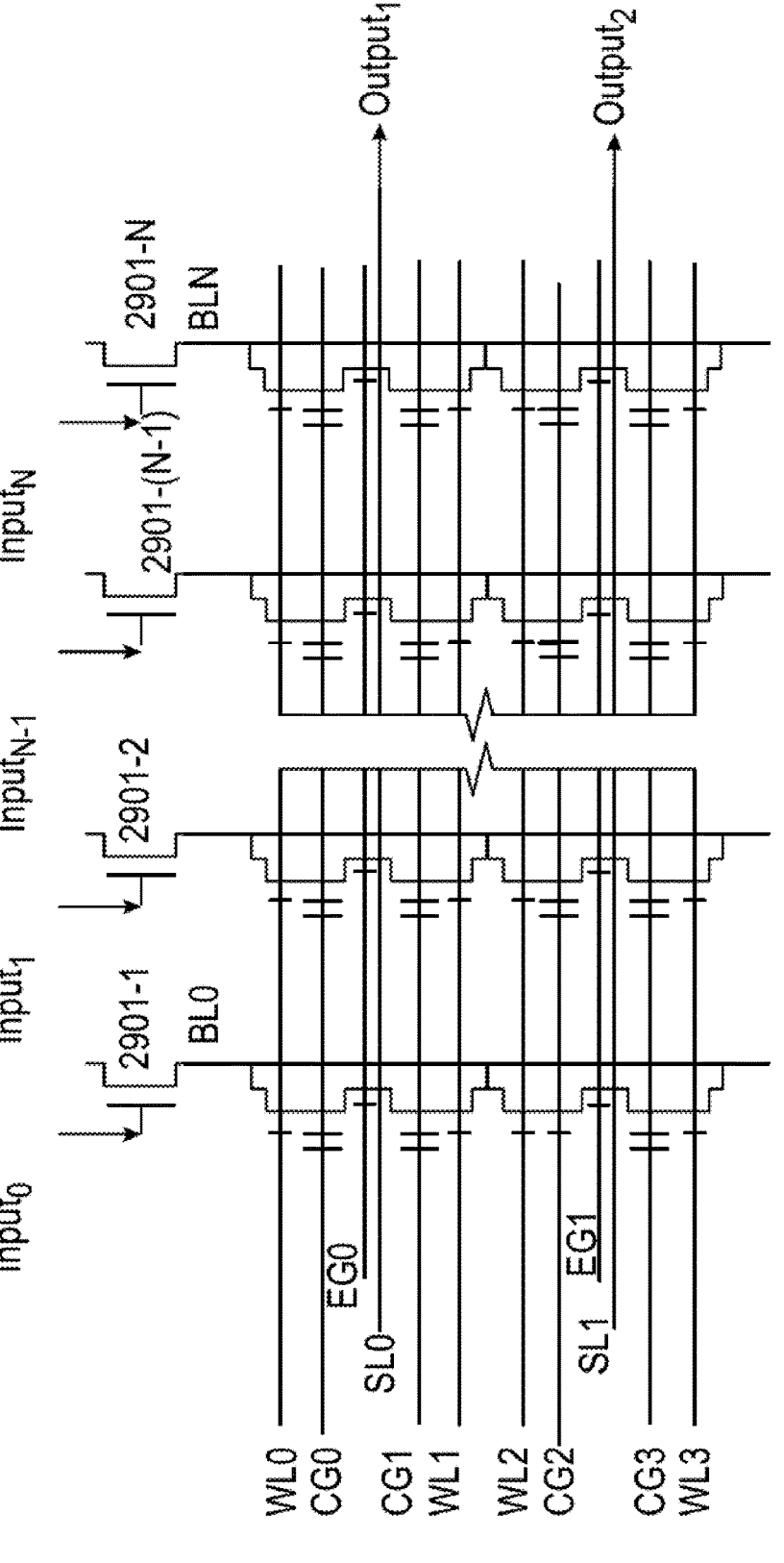
FIG. 27 depicts another embodiment of a vector-by-matrix multiplication system.
Figure 28:
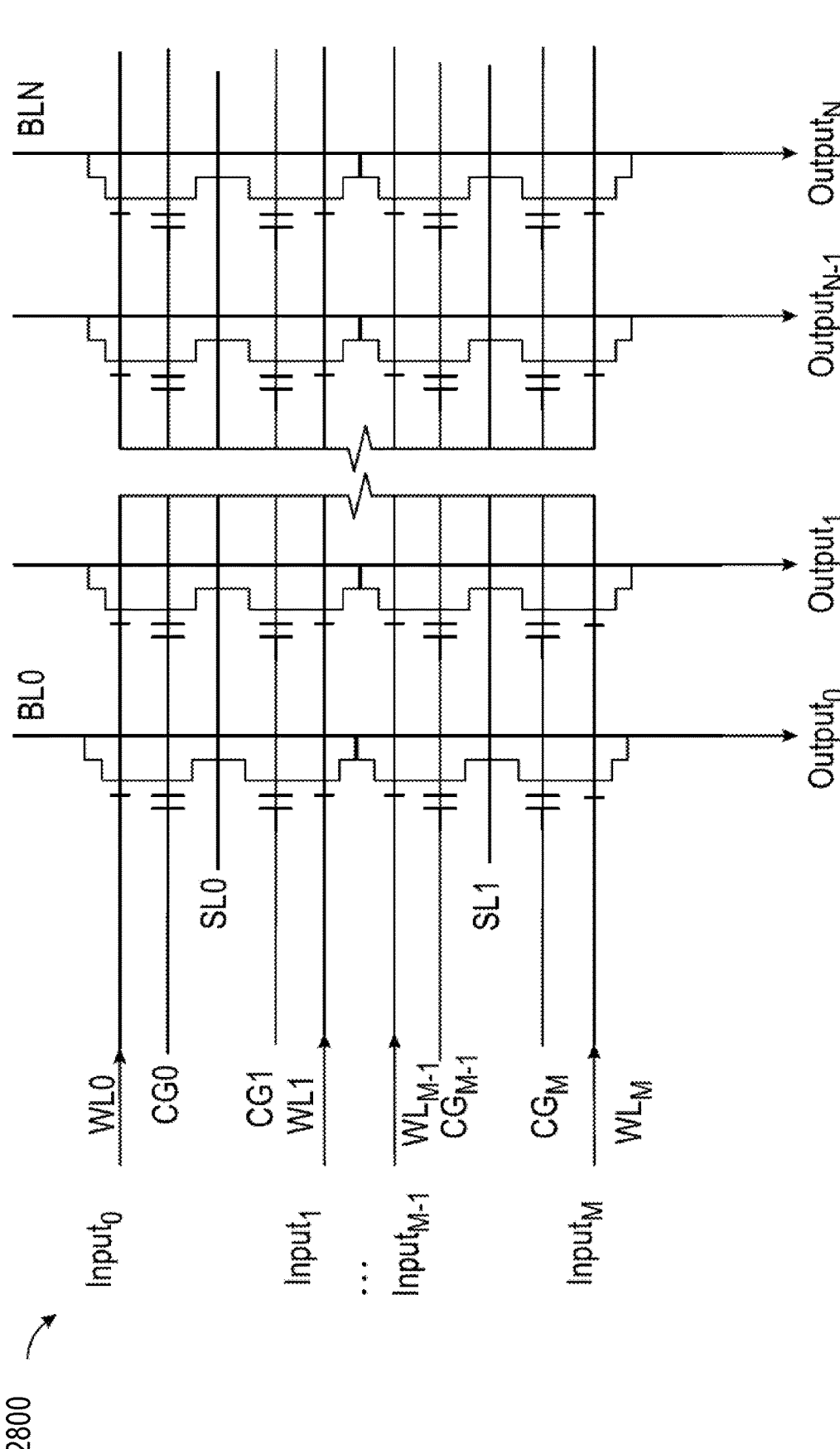
FIG. 28 depicts another embodiment of a vector-by-matrix multiplication system.
Figure 29:
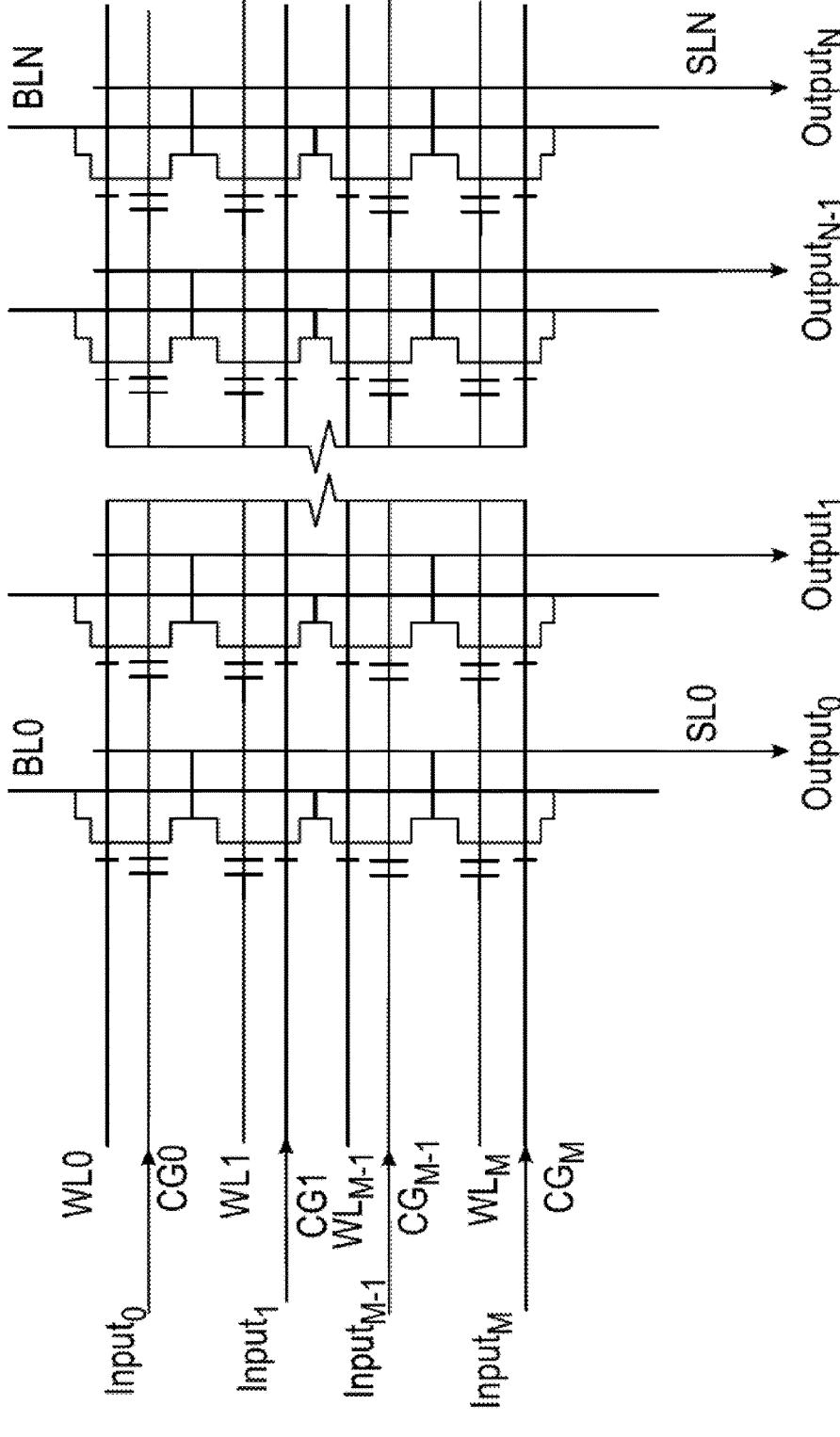
FIG. 29 depicts another embodiment of a vector-by-matrix multiplication system.
Figure 30:
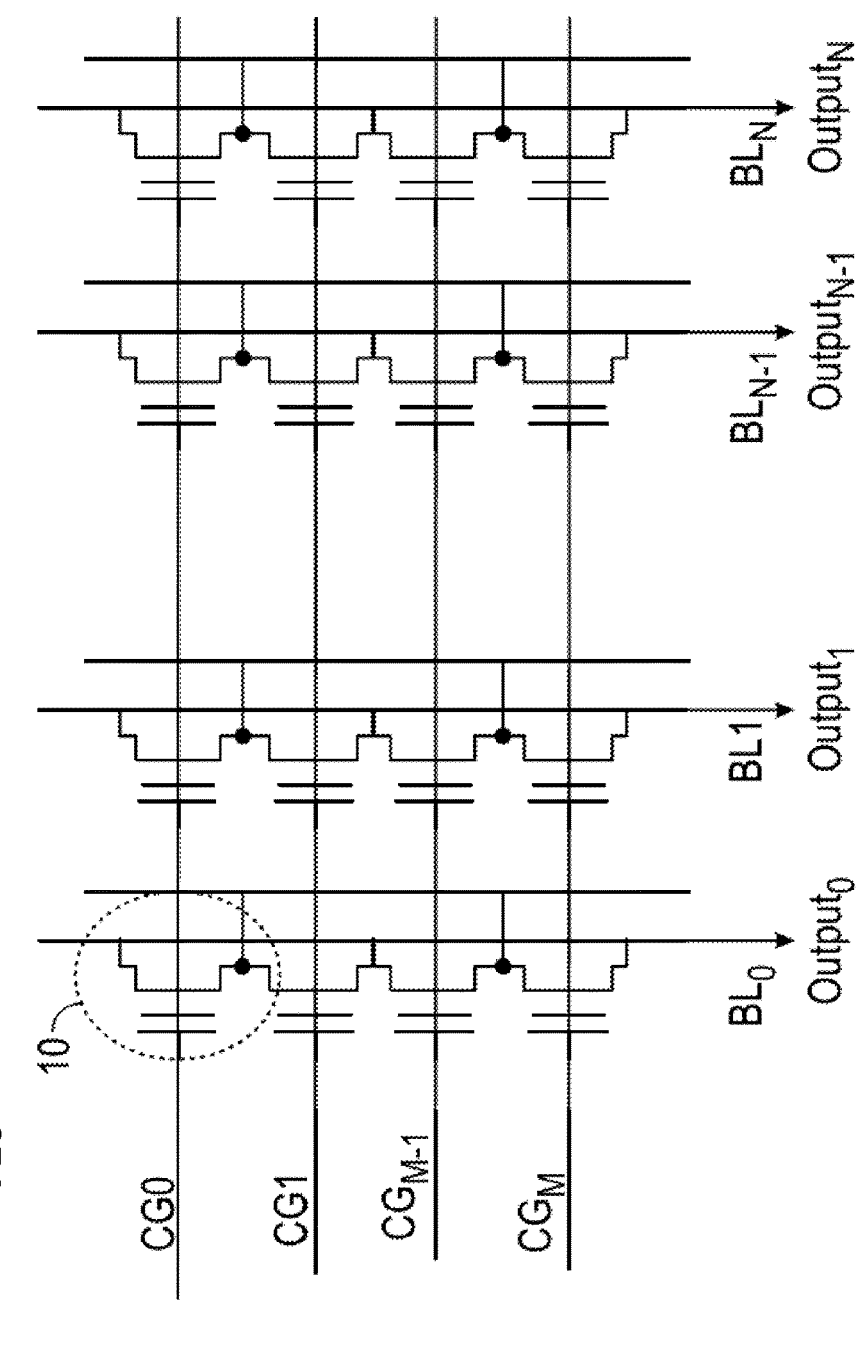
FIG. 30 depicts another embodiment of a vector-by-matrix multiplication system.
Figure 31:
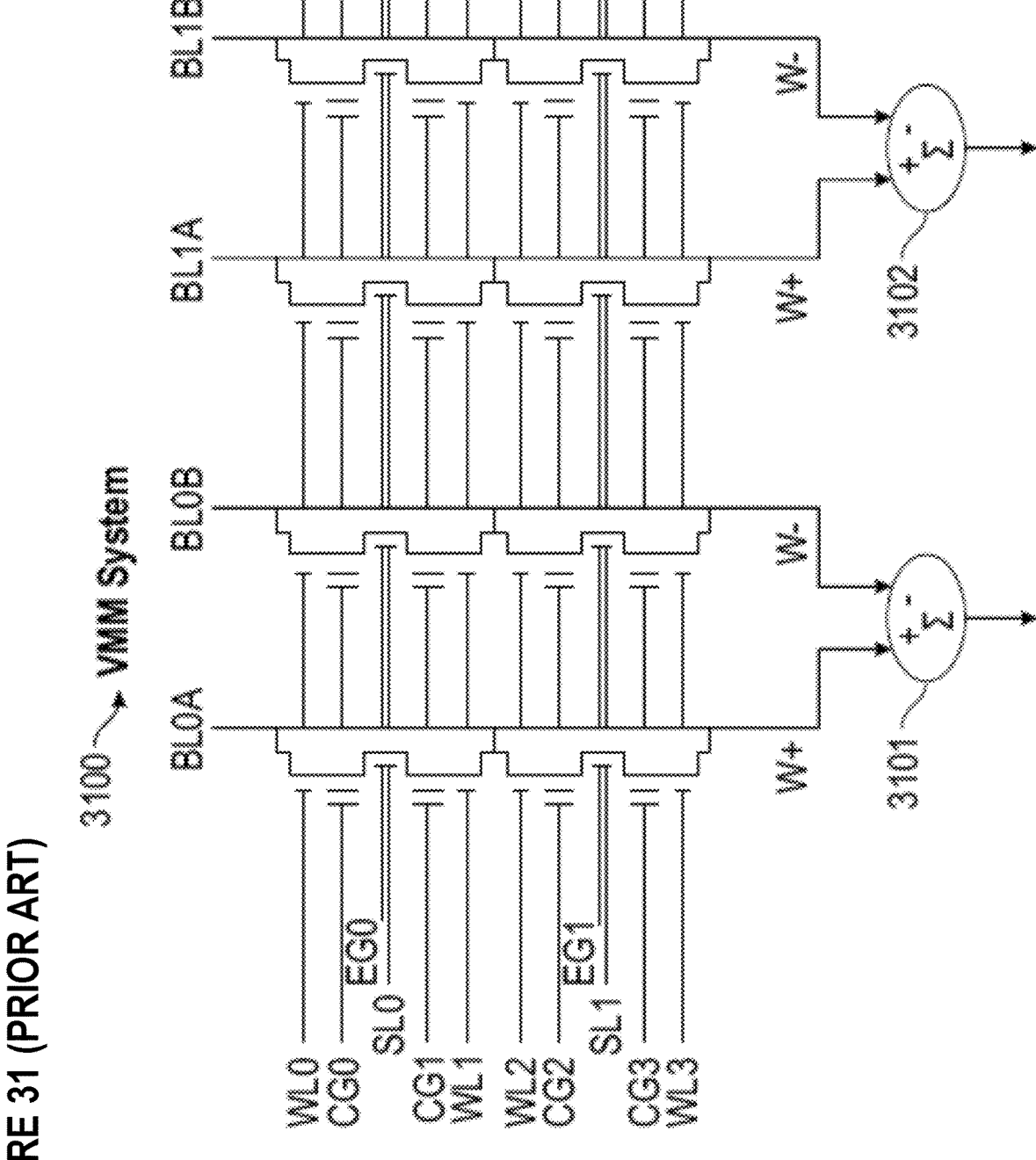
FIG. 31 depicts another embodiment of a vector-by-matrix multiplication system.
Figure 32:
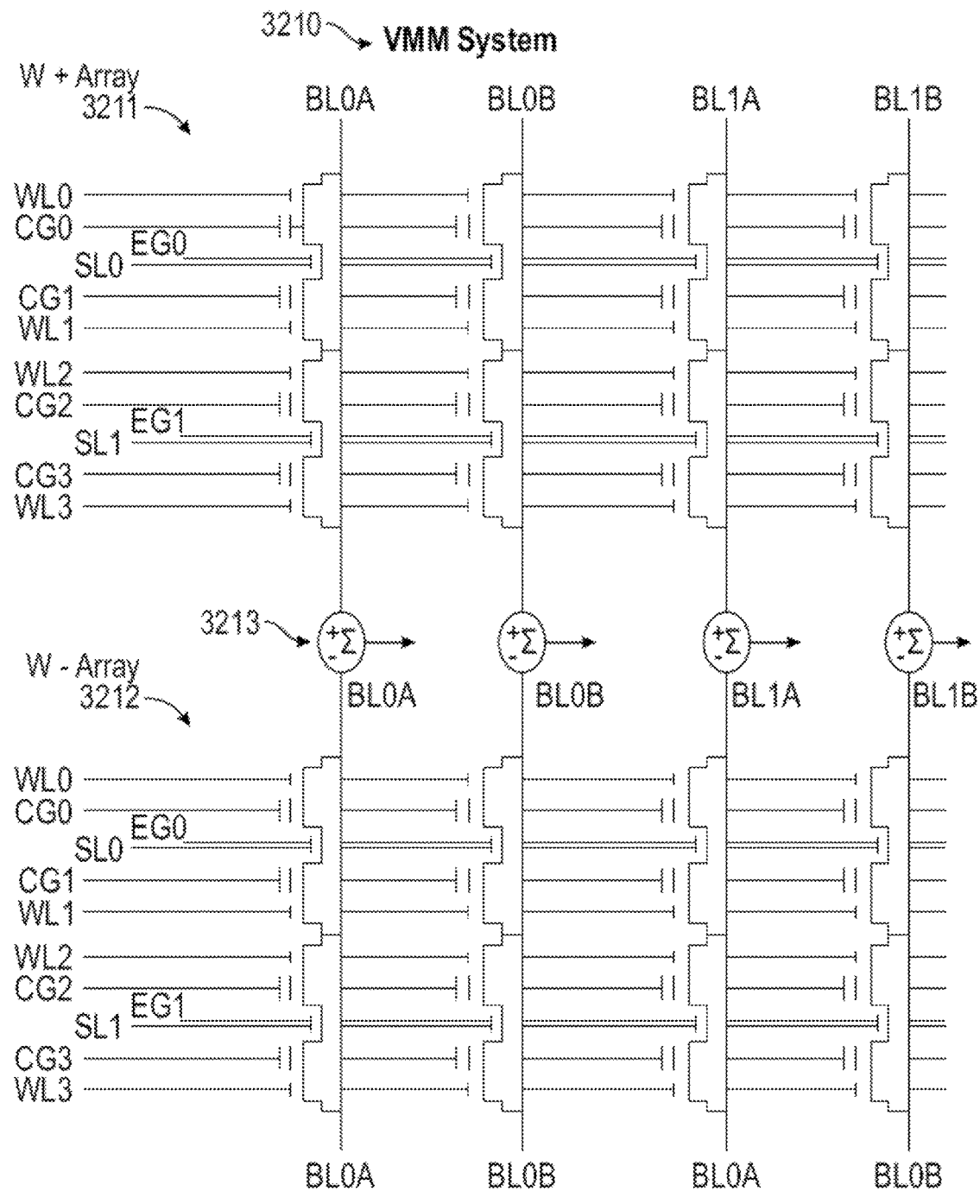
FIG. 32 depicts another embodiment of a vector-by-matrix multiplication system.
Figure 33:
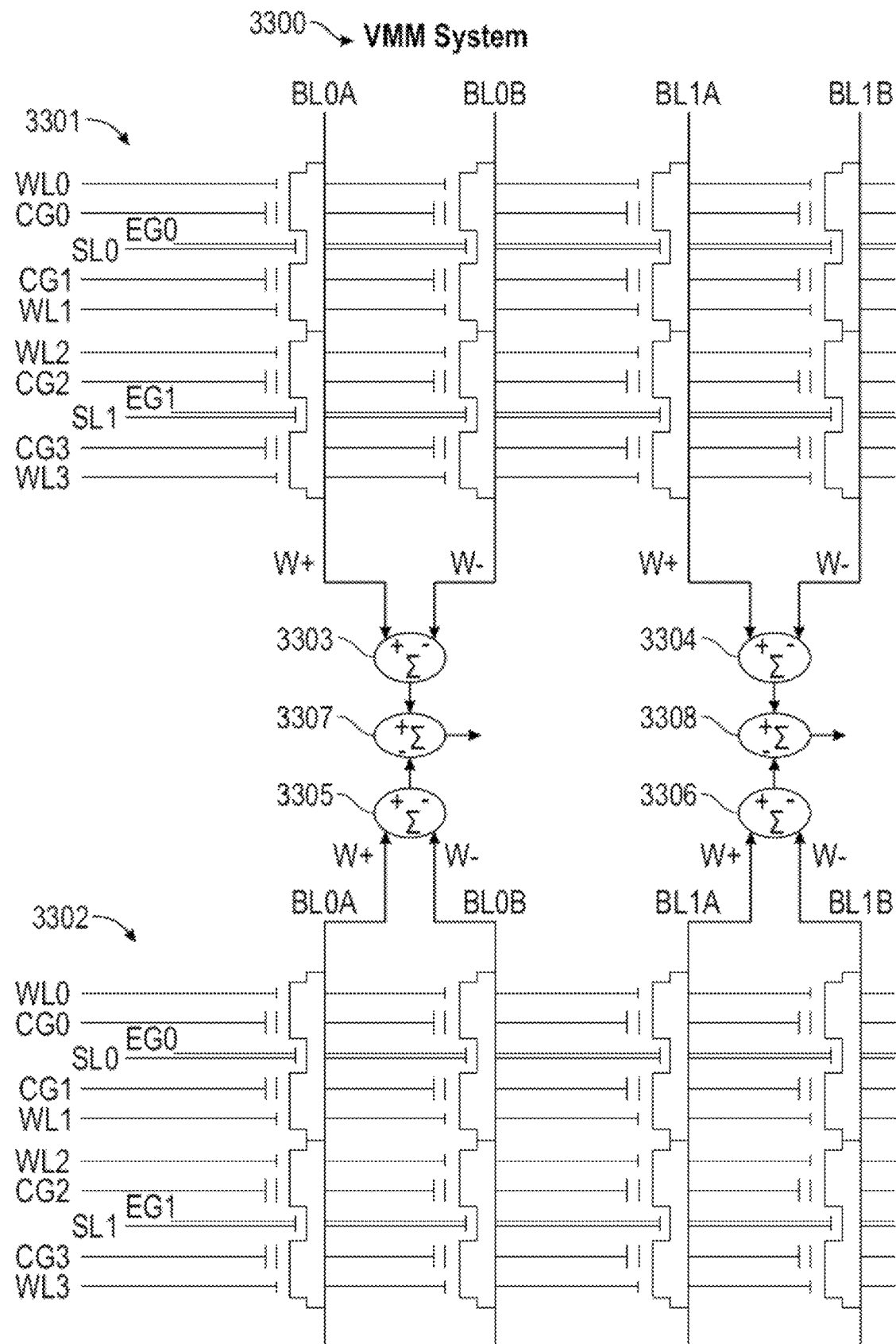
FIG. 33 depicts another embodiment of a vector-by-matrix multiplication system.
Figure 34:
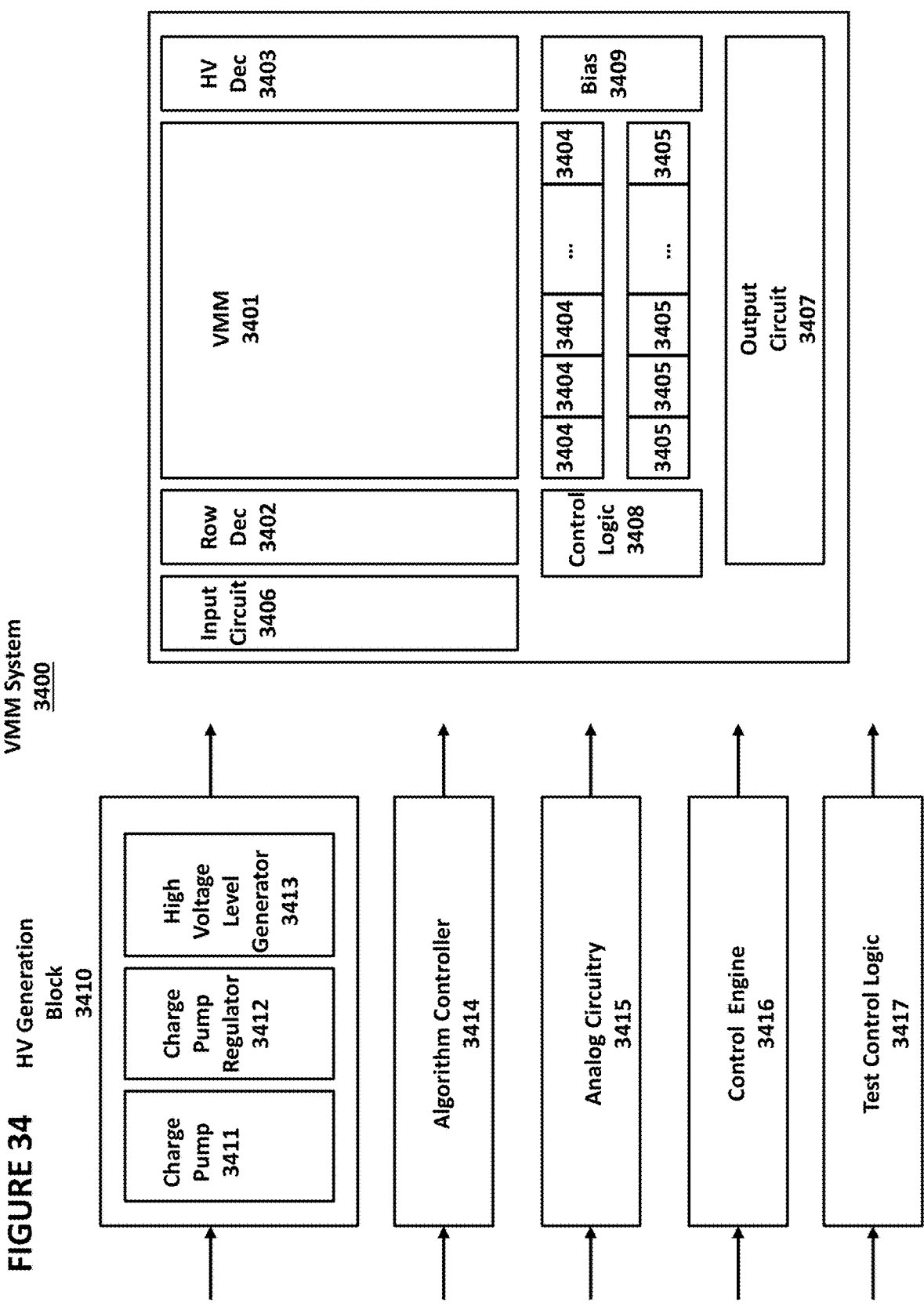
FIG. 34 depicts another embodiment of a vector-by-matrix multiplication system.

FIG. 34 depicts a block diagram of VMM system 3400. VMM system 3400 comprises VMM array 3401, row decoder 3402, high voltage decoder 3403, column decoder 3404, bit line drivers 3405, input circuit 3406, output circuit 3407, control logic 3408, and bias generator 3409. VMM system 3400 further comprises high voltage generation block 3410, which comprises charge pump 3411, charge pump regulator 3412, and high voltage analog precision level generator 3413. VMM system 3400 further comprises (program/erase, or weight tuning) algorithm controller 3414, analog circuitry 3415, control engine 3416 (that may include special functions such as arithmetic functions, activation functions, embedded microcontroller logic, without limitation), and test control logic 3417. The systems and methods described below can be implemented in VMM system 3400.

Input circuit 3406 may include circuits such as a DAC (digital to analog converter), DPC (digital to pulses converter, digital to time modulated pulse converter), AAC (analog to analog converter, such as a current to voltage converter, logarithmic converter), PAC (pulse to analog level converter), or any other type of converters. The input circuit 3406 may implement normalization, linear or non-linear up/down scaling functions, or arithmetic functions. The input circuit 3406 may implement a temperature compensation function for input levels. The input circuit 3406 may implement an activation function such as ReLU or sigmoid. The output circuit 3407 may include circuits such as a ADC (analog to digital converter, to convert neuron analog output to digital bits), AAC (analog to analog converter, such as a current to voltage converter, logarithmic converter), APC (analog to pulse(s) converter, analog to time modulated pulse converter), or any other type of converters. Output circuit 3407 may implement an activation function such as rectified linear activation function (ReLU) or sigmoid. The output circuit 3407 may implement statistic normalization, regularization, up/down scaling/gain functions, statistical rounding, or arithmetic functions (e.g., add, subtract, divide, multiply, shift, log) for neuron outputs. Output circuit 3407 may implement a temperature compensation function for neuron outputs or array outputs (such as bitline output) so as to keep power consumption of the array approximately constant or to improve precision of the array (neuron) outputs such as by keeping the IV slope approximately the same.

Figure 35A:
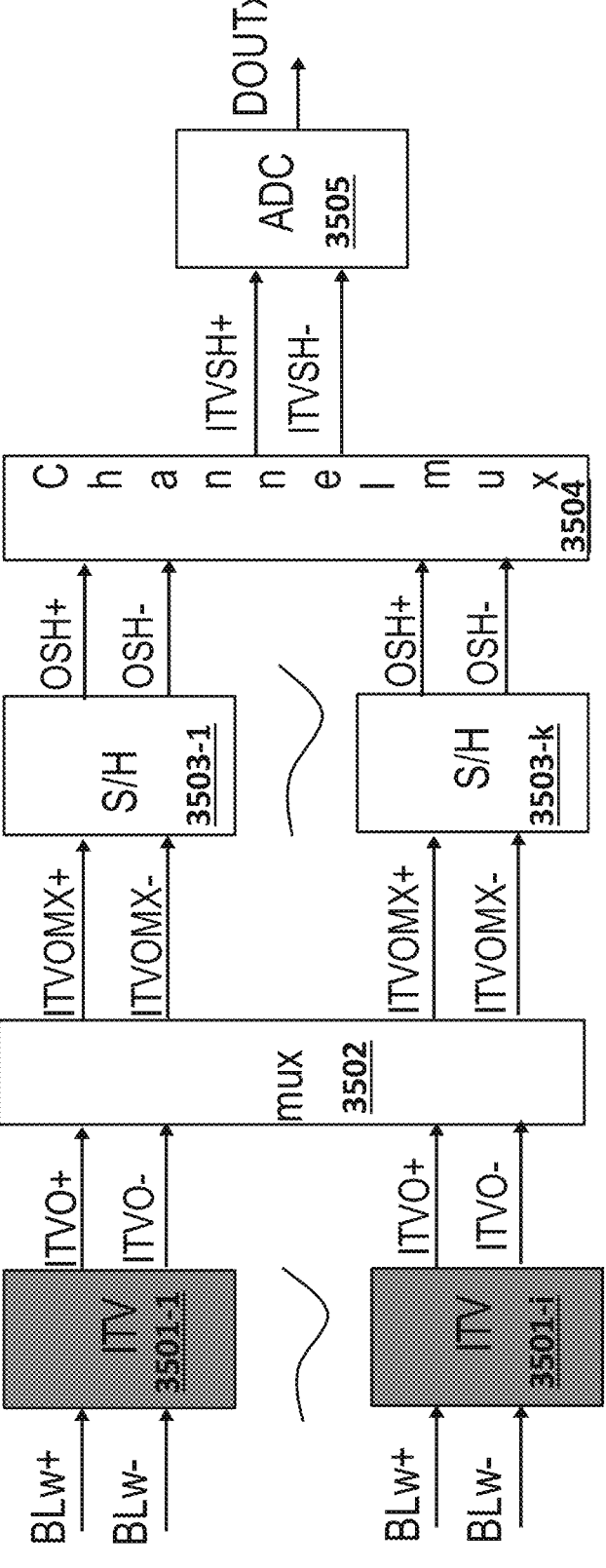

FIG. 35A depicts output block 3500. Output block 3500 comprises current-to-voltage converters (ITV, with differential inputs and differential outputs) 3501-1 through 3501-*i*, where i is the number of bit line W+ and W− pairs received by output block 3500; multiplexor 3502; sample and hold circuits 3503-1 through 3503-*k*, channel multiplexor 3504, and differential input analog-to-digital converter (ADC) 3505. Output block 3500 receives differential weight outputs W+ and W− from bit line pairs in the array, and ultimately generates a digital output, DOUTx, representing the output of one of the bit line pairs (e.g., W+ and W− lines) from the ADC 3505 (ADC with differential inputs).

Current-to-voltage (ITV) converters 3501-1 through 3501-*i* each receive analog bit line current signals BLw+ and BLw− (which are bit line outputs generated in response to inputs and stored W+ and W-weights, respectively) and convert them into respective differential voltages ITVO+ and ITVO−.

Differential voltages ITVO+ and ITVO− are then received by multiplexor 3502, which time-multiplexes the outputs from current-to-voltage converters 3501-1 through 3501-*i* to the sample and hold (S/H) circuits 3503-1 to 3503*k*, where k can be the same as or different than i.

S/H circuits 3503-1 to 3503-*k* each sample its received differential voltages and holds them as a differential output.

Channel multiplexor 3504 receives a control signal to select one of the bit line W+ and W− channels, i.e., one of the bit line pairs, and outputs the differential voltages held by the respective sample and hold circuit 3503 to ADC 3505, which converts the analog differential voltages that are output by the respective sample and hold circuit 3503 into a set of digital bits, DOUTx. A single S/H 3503 can be shared across the multiple ITV converters 3501. The ADC 3505 can operate on multiple ITV converters in a time-multiplexed manner. Each S/H 3503 can be just a capacitor or a capacitor followed by a buffer (e.g., operational amplifier).

Figure 40:
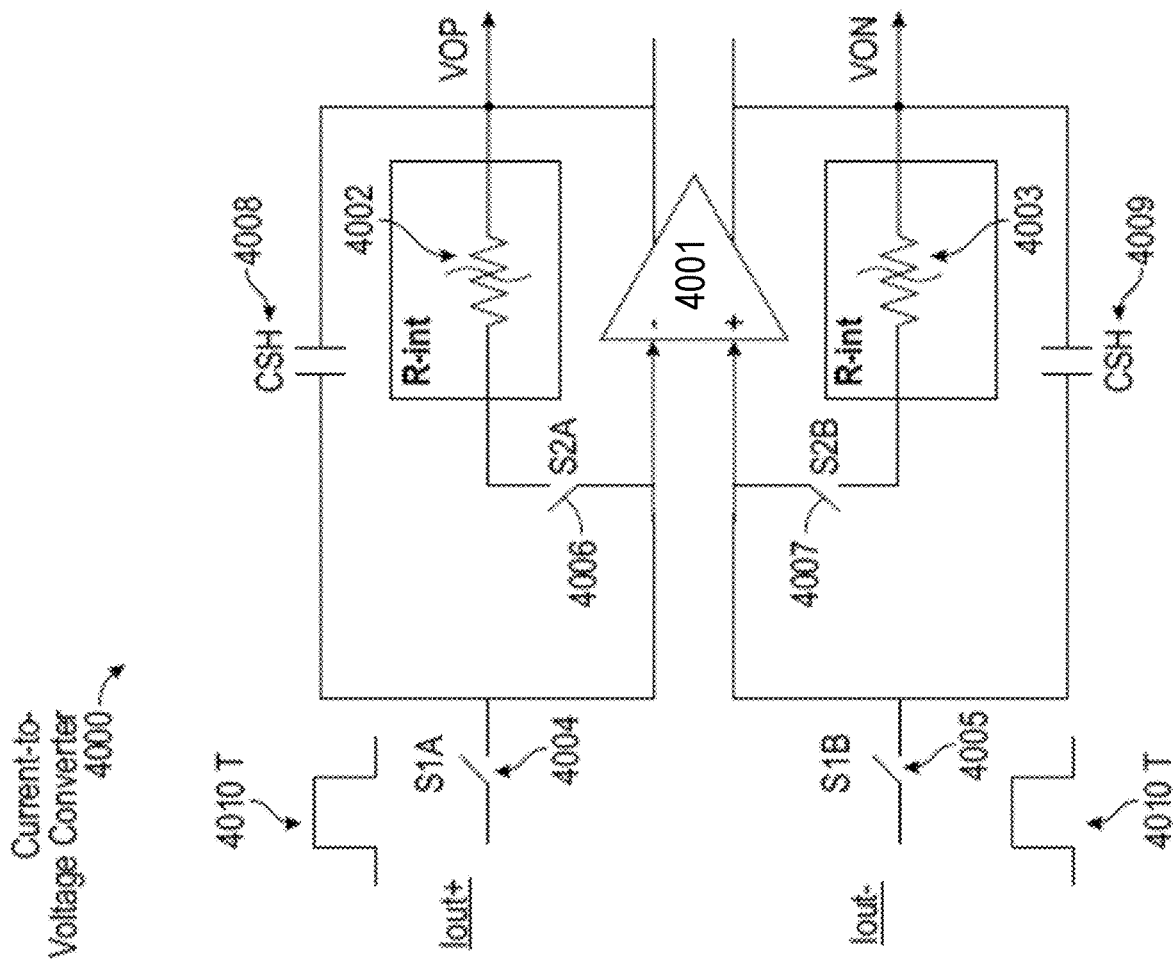
FIG. 40 depicts an embodiment of a current-to-voltage converter.

The ITV converters 3501 can comprise output current neuron circuit 3700, 3750, 3800, or 3820 from FIGS. 37A, 37B, 38A, and 38B, respectively, combined with current-to-voltage converter 4000 in FIG. 40. In such an instance, the inputs to ITV converters 3501 would be two current inputs (such as BLW+ and BLW− in FIG. 35A to 35E, 37A, 37B, 38A, or 38B) and the outputs of ITV converters are differential outputs (such as VOP and VON in FIG. 40 or ITVO+ and ITVO− in FIGS. 35A to 35D).

ADC 3505 can be of a hybrid ADC architecture, meaning it has more than one ADC architecture to perform conversion. For example, if DOUTx is an 8-bit output, ADC 3505 can comprise an ADC sub-architecture to generate bits B7-B4 and another ADC sub-architecture to generate bits B3-B0 from the differential inputs ITVSH+ and ITVSH−. That is, ADC circuit 3505 can include multiple ADC sub-architectures.

Optionally, an ADC sub-architecture can be shared among all channels while another ADC sub-architecture is not shared among all channels.

In another embodiment, channel multiplexor 3504 and ADC 3505 can be removed, and the output instead can be analog differential voltages from a S/H 3503, which can be buffered by an operational amplifier. For example, the use of an analog voltage can be implemented in an all-analog neural network (i.e., one where a digital output or digital input is not needed for the neural memory array).

Figure 35B:
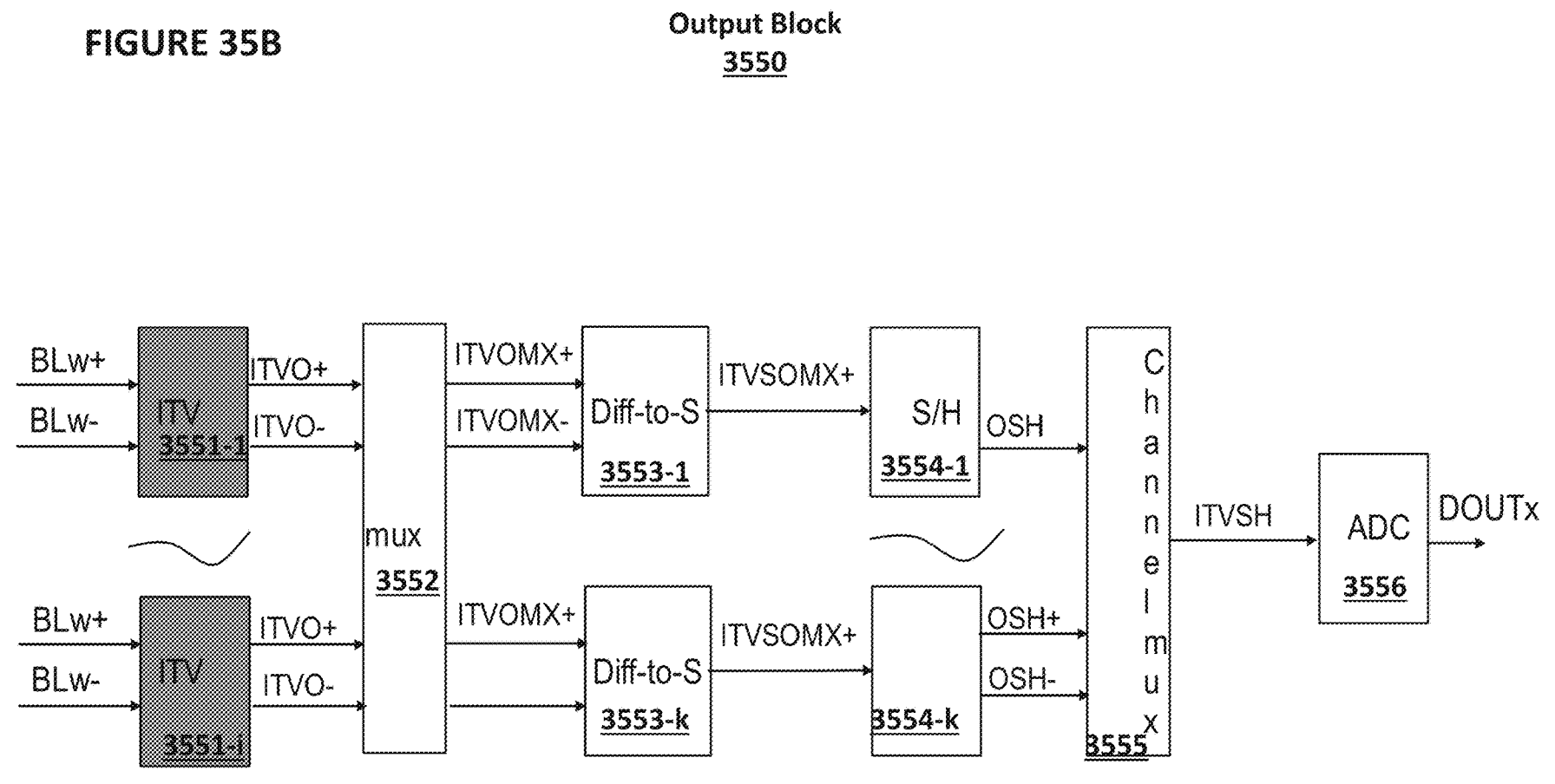

FIG. 35B depicts output block 3550. Output block comprises current-to-voltage converters (ITV) 3551-1 through 3551-*i*, where i is the number of bit line W+ and W− pairs received by output block 3550; multiplexor 3552; differential to single ended converters Diff-to-S Converter 3553-1 to 3553-*k*, sample and hold circuits 3554-1 through 3554-*k* (where k is the same as or different than i), channel multiplexor 3555, and analog-to-digital converter (ADC) 3556. Diff-to-S converter 3553 is used to convert the differential outputs from the ITV 3551 signal provided by mux 3552, i.e. ITVOMX+ and ITVOMX− into a singled-ended output ITVSOMX+. The singled-ended output ITVSOMX+ is then input to the S/H 3554, multiplexor 3555, and ADC 3556.

Figures 35C, 35D:
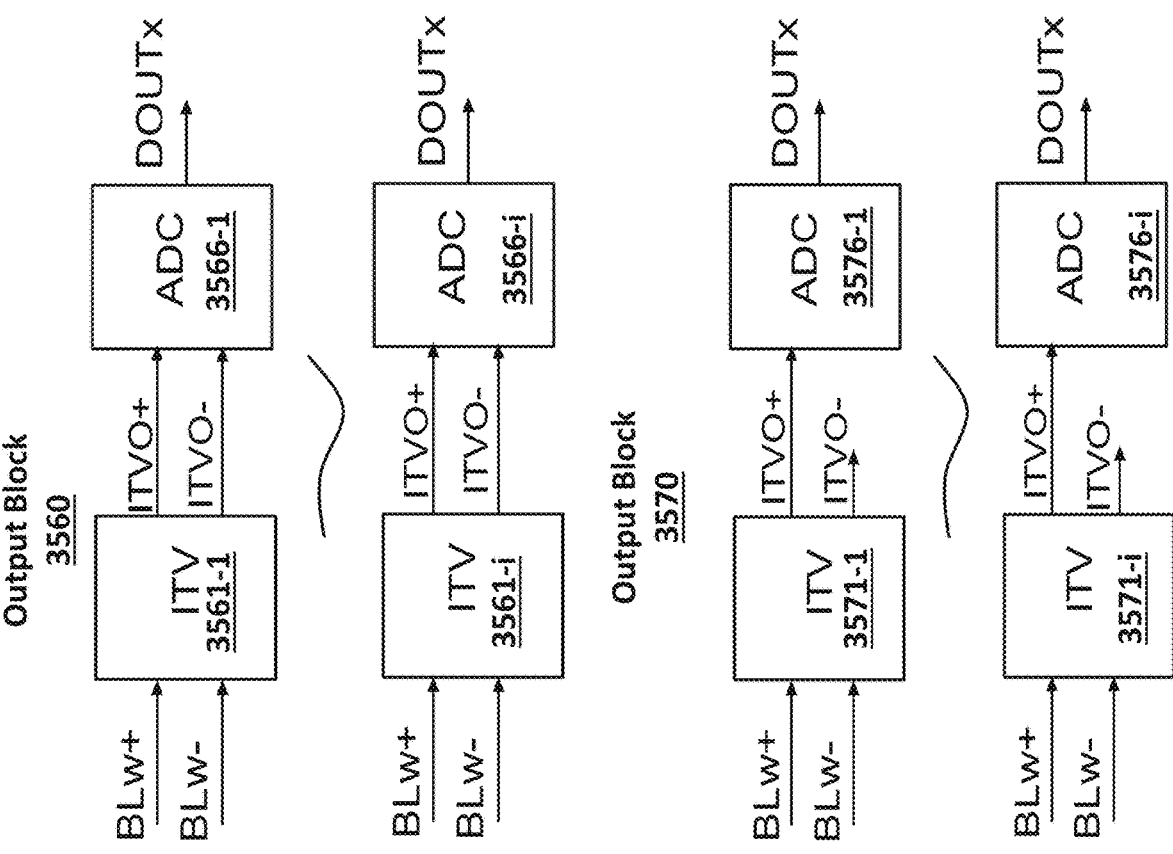

FIG. 35C depicts output block 3560. Output block 3560 comprises current-to-voltage converters (ITV) 3561-1 through 3561-*i*, where i is the number of bit line W+ and W-pairs received by output block 3560, and differential input analog-to-digital converter (ADC) 3566-1 through 3566-*i*.

FIG. 35D depicts output block 3570. Output block 3570 comprises current-to-voltage converters (ITV) 3571-1 through 3571-*i*, where i is the number of bit line W+ and W-pairs received by output block 3570, and single input analog-to-digital converter (ADC) 3576-1 through 3576-*i*. In this case only one output of the differential output ITV is used, the ITV is used with differential inputs and single output.

Figure 35E:

FIG. 35E depicts output block 3580. Output block 3580 comprises current-to-voltage converters (ITV) 3581-1 through 3581-*i*, where i is the number of bit line W+ and W-pairs received by output block 3580, and differential input analog-to-digital converter (ADC) 3586-1 through 3586-*i*. ITV blocks 3581-1 through 3581-*i* comprise common mode input circuit 3582-1 through 3582-*i*, respectively, and differential operational amplifier 3583-1 through 3583-I, respectively, with feedback provided by variable resistors 3584-1 through 3584-*i*, respectively, and 3585-1 through 3585-*i*, respectively.

Figure 35F:
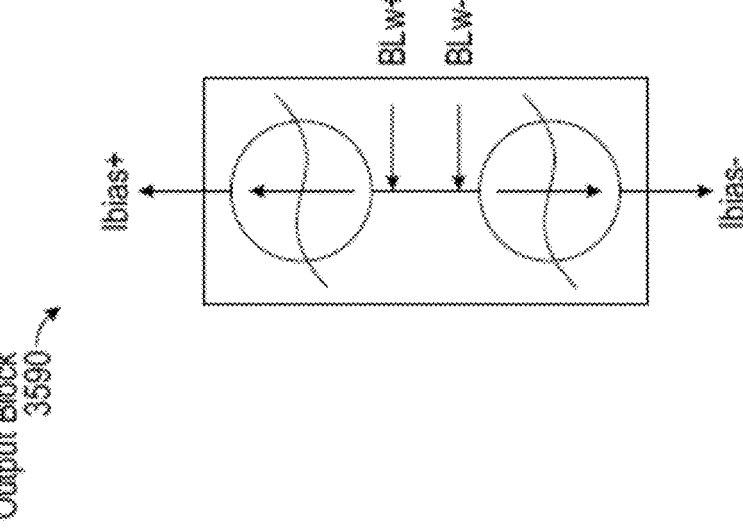

FIG. 35F depicts output block 3590, which could be used for common mode inputs circuits 3582-1 through 3582-*i* in FIG. 35E. Output block 3591 comprises two equal variable current sources Ibias+ and Ibias− connected to two current inputs, BLw+ and BLw−.

Figure 36:
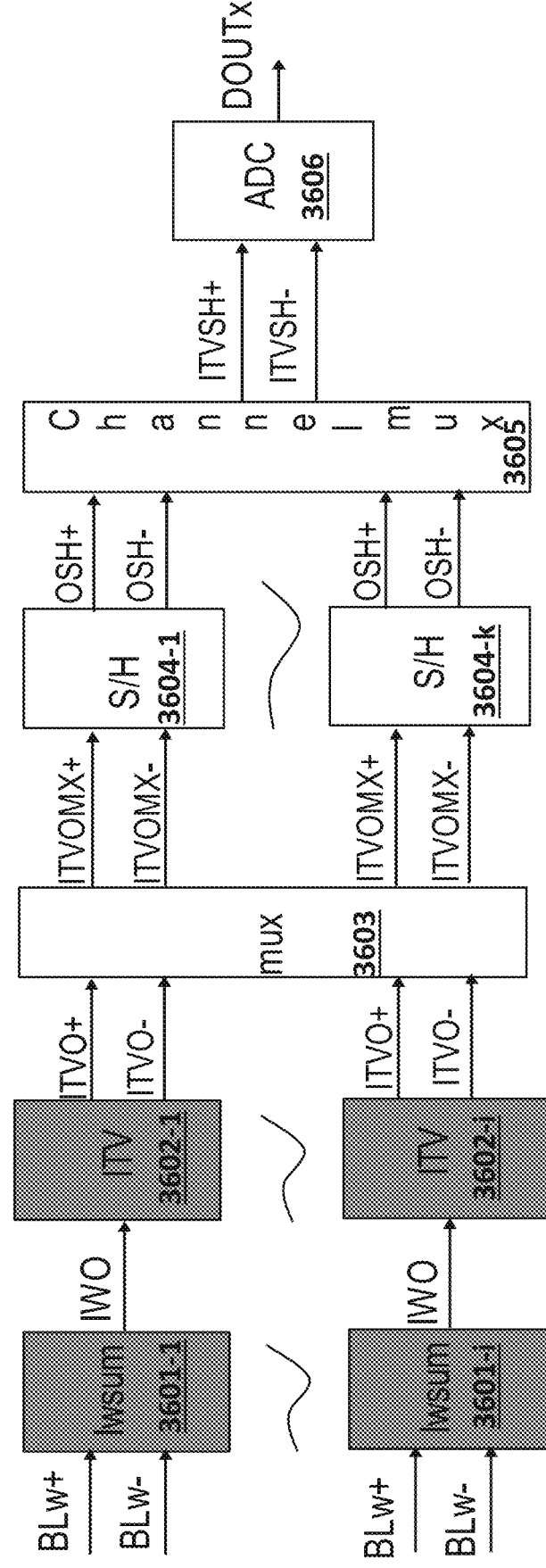
FIG. 36 depicts another embodiment of an output block.

FIG. 36 depicts output block 3600. Output block comprises summation circuits 3601-1 through 3601-*i* (such as a current mirror circuit), where i is the number of bit line BLw+ and BLw− pairs received by output block 3600; current-to-voltage converter circuits (ITV) 3602-1 through 3602-*i*, multiplexor 3603; sample and hold circuits 3604-1 through 3604-*k* (where k is the same as or different than i), channel multiplexor 3605, and ADC 3606. Output block 3600 receives differential weight outputs BLw+ and BLw− from bit line pairs in the array, and ultimately generates a digital output from ADC 3606, DOUTx, representing the output of one of the bit line pairs at a time.

Current summation circuits 3601-1 through 3601-*i* each receive current from a pair of bit lines and subtract the BLw− value from the BLw+ value and output the result as a summation current IWO.

Current-to-voltage converters 3602-1 through 3602-*i* receive the output summation current IWO and convert the respective summation current into differential voltages ITVO+ and ITVO−, which are then received by multiplexor 3603 and selectively provided to sample-and-hold circuits 3604-1 through 3604-*k*. The differential voltages are to be digitized (converted into a digital output bits) by a differential input ADC (block 3606), which has various advantages such as input noise reduction (such as from clock feed-through) and more accurate comparison operation (as in SAR ADC).

Each sample and hold circuit 3604 receives differential voltages ITVOMX+ and ITVOMX−, samples the received differential voltages, and holds them as a differential voltage output, OSH+ and PSH−.

Channel multiplexor 3605 receives a control signal to select one of the bit line pairs, i.e., channels, BLw+ and BLw− and outputs the voltage held by the respective sample and hold circuit 3604 to differential input ADC 3606, which converts the voltage into a set of digital bits as DOUTx.

Figure 37A:
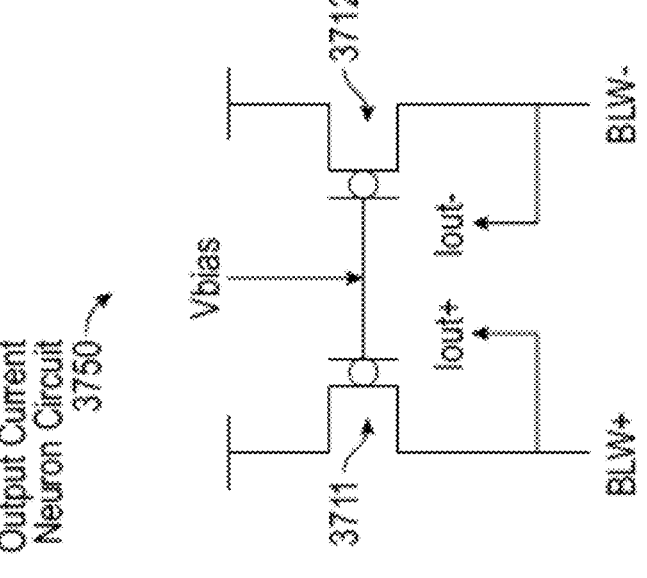

FIG. 37A depicts output current neuron circuit 3700, which optionally can be included in output block 3500 of FIG. 35 or output block 3600 of FIG. 36.

Output current neuron circuit 3700 comprises first variable current source 3701, second variable current source 3702, and bias circuit 3703. Bias circuit 3703 generates a control voltage, Vbias, based on a comparison of BLW+ and VREF or BLW− and VREF. First variable current source 3701 generates an output current, Ibias+, that is varied by a control voltage, Vbias, (i.e. the amount of output current Ibias+ is responsive to the value of Vbias) and is coupled to a first bit line, BLW+. Second variable current source 3702 generates an output current, Ibias−, that is varied by Vbias (i.e. the amount of output current Ibias− is responsive to the value of Vbias) and is coupled to a second bit line, BLW−. BLW+ is selected by a column decoder (not shown) and receives a first current from cells storing W+ values during a read operation, and BLW− is selected by the column decoder and receives a second current from cells storing W− values during the read operation. A W+ value and associated W− value represent a weight value, W. The outputs, Ibias+ and Ibias−, of current sources 3701 and 3702 are identical at any given time.

VREF is applied as a input common mode voltage to generate Vbias voltage to control variable current sources 3701 and 3702 to impose a common mode voltage on BLW+ and BLW−, where the input common mode voltage acts as a reference read voltage on the bitlines during a read operation. The output of output current neuron circuitry 3700 is Iout+ and Iout–, which form a differential signal. Iout+ is the output current from bit line BLW+ after Vbias has been applied to generate Ibias+, and Iout– is the output current from bit line BLW– after Vbias has been applied to generate Ibias–, where Iout+=Ibias+–IBLW+ and Iout–=Ibias––IBLW–.

FIG. 37B depicts output current neuron circuit 3750 which depicts an embodiment of variable current sources 3701 and 3702 using PMOS transistors 3711 and 3712.

Figure 38A:
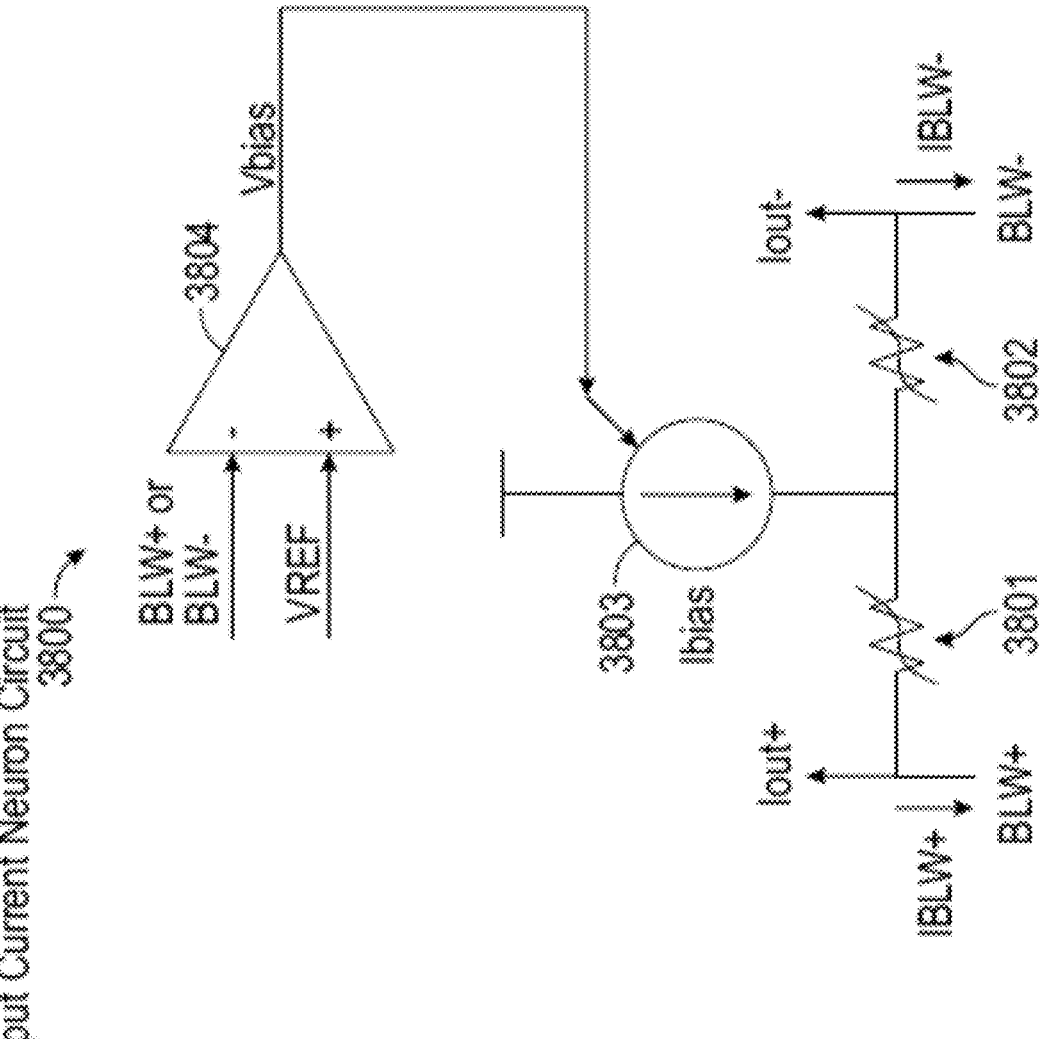
FIGS. 38A and 38B depicts another embodiment of an output block.

FIG. 38A depicts output current neuron circuit 3800, which optionally can be included in output block 3500 of FIG. 35, output block 3550 of FIG. 35B or output block 3600 of FIG. 36.

Output current neuron circuit 3800 comprises a first variable resistor 3801 (a first device) comprising a first end and a second end, the second end coupled to bit line BLW+ that is selected during a read operation; a second variable resistor 3802 (a second device) comprising a third end and a fourth end, the fourth end coupled to bit line BLW– that is selected during a read operation, where BLW+ is connected to cells in a memory array storing W+ values and BLW– is connected to cells in the memory array storing associated W– values; variable current source 3803; and bias circuit op amp 3804 that generates a bias voltage, Vbias, whose value represents the difference between BLW+ (or, alternatively, BLW–) and VREF. The first end of first variable resistor 3801 and the third end of second variable resistor 3802 are coupled to variable current source 3803.

VREF is used to generate Vbias voltage that is applied to variable current source 3803 to impose an input common mode voltage to bit lines BLW+ and BLW–, where the input common mode voltage acts as a read reference voltage on the bitlines during a read operation. The output of output current neuron circuitry 3800 is Iout+ (a first output current) from first variable resistor 3801 and Iout– (a second output current) from second variable resistor 3802, which form a differential current signal. Iout+ is the output current from bit line BLW+ after Vbias has been applied to generate Ibias, and Iout– is the output current from bit line BLW– after Vbias has been applied to generate Ibias, according to the following: Iout+=Ibias–IBLW+ and Iout–=Ibias–IBLW–.

Figure 38B:
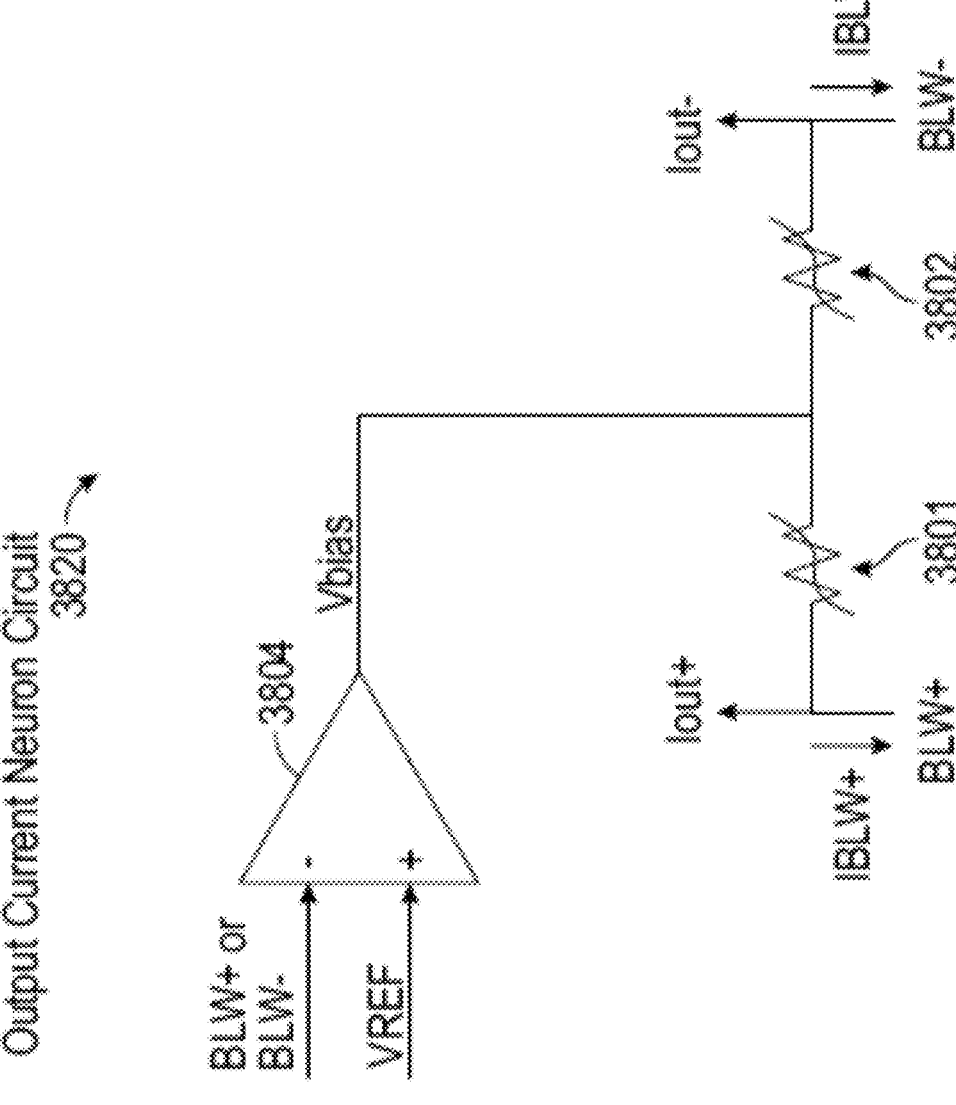

FIG. 38B depicts output current neuron circuit 3820, which optionally can be included in output block 3500 of FIG. 35, output block 3550 of FIG. 35B or output block 3600 of FIG. 36. The circuit is similar to that of the circuit in FIG. 38A except the output of the op amp 3804 drives directly into two terminals of the two variable resistors 3801 and 3802.

Figure 39:
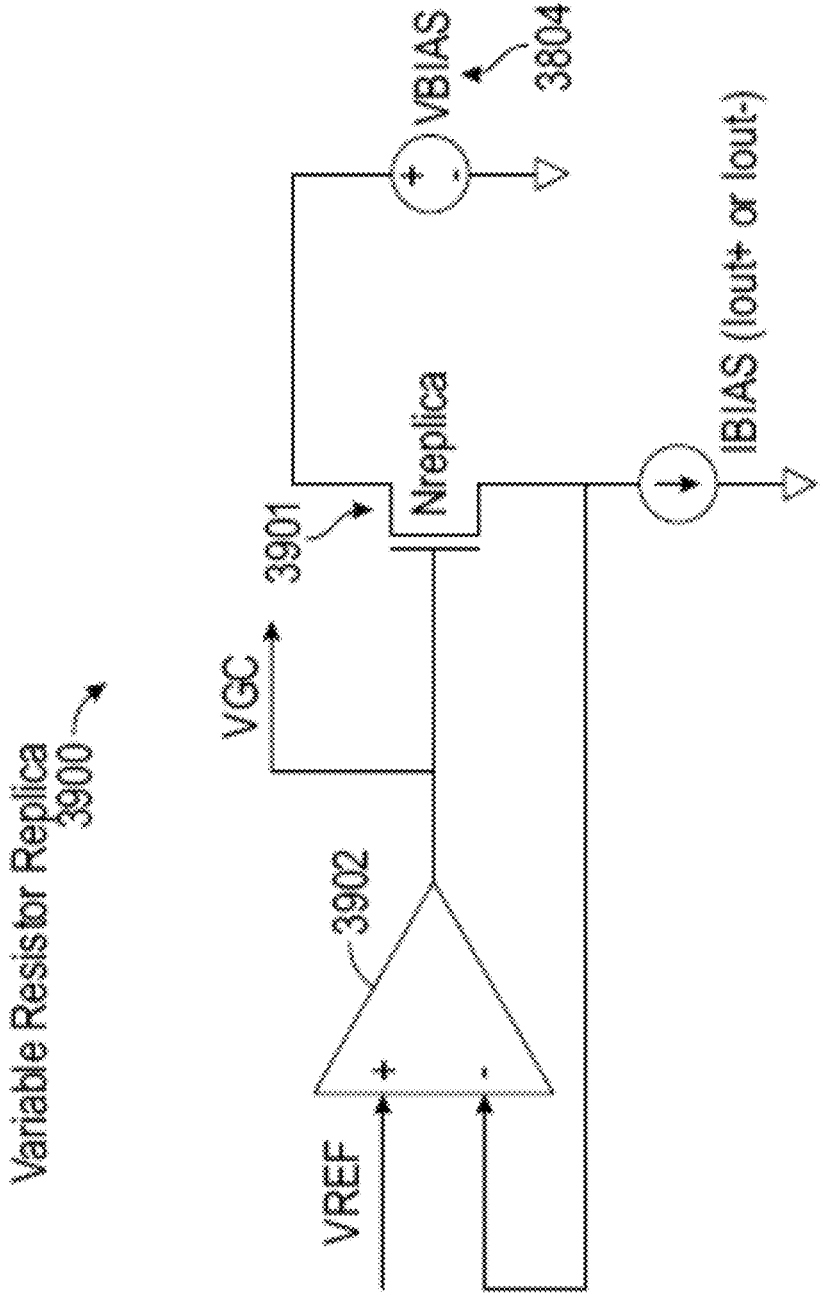
FIG. 39 depicts a variable resistor replica.

FIG. 39 depicts variable resistor replica 3900, which optionally can be used in place of variable resistor 3801 and/or variable resistor 3802 in FIG. 38. Variable resistor replica 3900 comprises NMOS transistor 3901. One terminal of NMOS transistor 3901 is coupled to bias circuit 3804. Another terminal of NMOS transistor 3901 is coupled to either BLW+ or BLW–. The gate of NMOS transistor 3901 is coupled to comparator 3902, which generates a control signal, VGC, that adjusts the resistance provided by NMOS transistor 3901. Hence, the resistance of NMOS 3901 is =VREF/IBIAS. By changing VREF or IBIAS, the equivalent resistance of the NMOS 3901 can be changed.

FIG. 40 depicts current-to-voltage converter 4000, which can be used for current-to-voltage converters 3501 in FIG. 35A, current-to-voltage converters 3511 in FIG. 35B or current-to-voltage converters 3602 in FIG. 36.

Current-to-voltage converter 4000 comprises differential amplifier 4001; variable integrating resistors 4002 and 4003;

controlled switches 4004, 4005, 4006, and 4007; and variable sample and hold capacitors 4008 and 4009, configured as shown.

Current-to-voltage converter 4000 receives differential currents IOUT+ and IOUT– and outputs voltages VOP and VON. The output voltage VOP=IOUT+*R and the output voltage VON=IOUT–*R, with resistors 4002 and 4003 each having value equal to R. The scaling of the output neuron is provided by the variation of the values of the resistors 4002 and 4003. For example, resistors 4002 and 4004 can each be provided by the resistor replica circuit 3900. The capacitor 4008 and 4009 serves as holding S/H capacitor, to hold the output voltage once the resistors 4002 and 4003 and the input currents are shut off. A control circuit (not shown) controls the opening and closing of switches 4004, 4005, 4006 and 4007 to provide an integration time.

In another mode of the operation, variable capacitors 4008 and 4009 are used to integrate the differential output current IOUT+ and IOUT–. In this case, resistors 4002 and 4003 are disabled (not used). The output voltage VOP is therefore proportional to Iout+*Time/C and the output voltage VON is therefore proportional to Iout–*Time/C. The value Time is controlled by the pulse width of pulse 4010 T. The C value is provided by the capacitors 4008 and 4009. The scaling of the output neuron values is then provided by the variation of the pulse-width T or the variation of the capacitance values of the capacitors 4008 and 4009 in this example.

The differential currents IOUT+ and IOUT– are derived from first bit line current BLW+ and second bit line current BLW–. IOUT+ and IOUT– have complementary values (one positive and the other negative with the same magnitude). The value of IOUT+=((current of BLW–)–(current of BLW+))/2, and IOUT–=((current of BLW+)–(current of BLW–))/2). For example, if the current of BLW+ is 1 μa and the current of BLW– is 31 μa, the Iout+=(31 μA–1 μA)/2=15 μA and Iout–=–15 μA.

Figure 41:
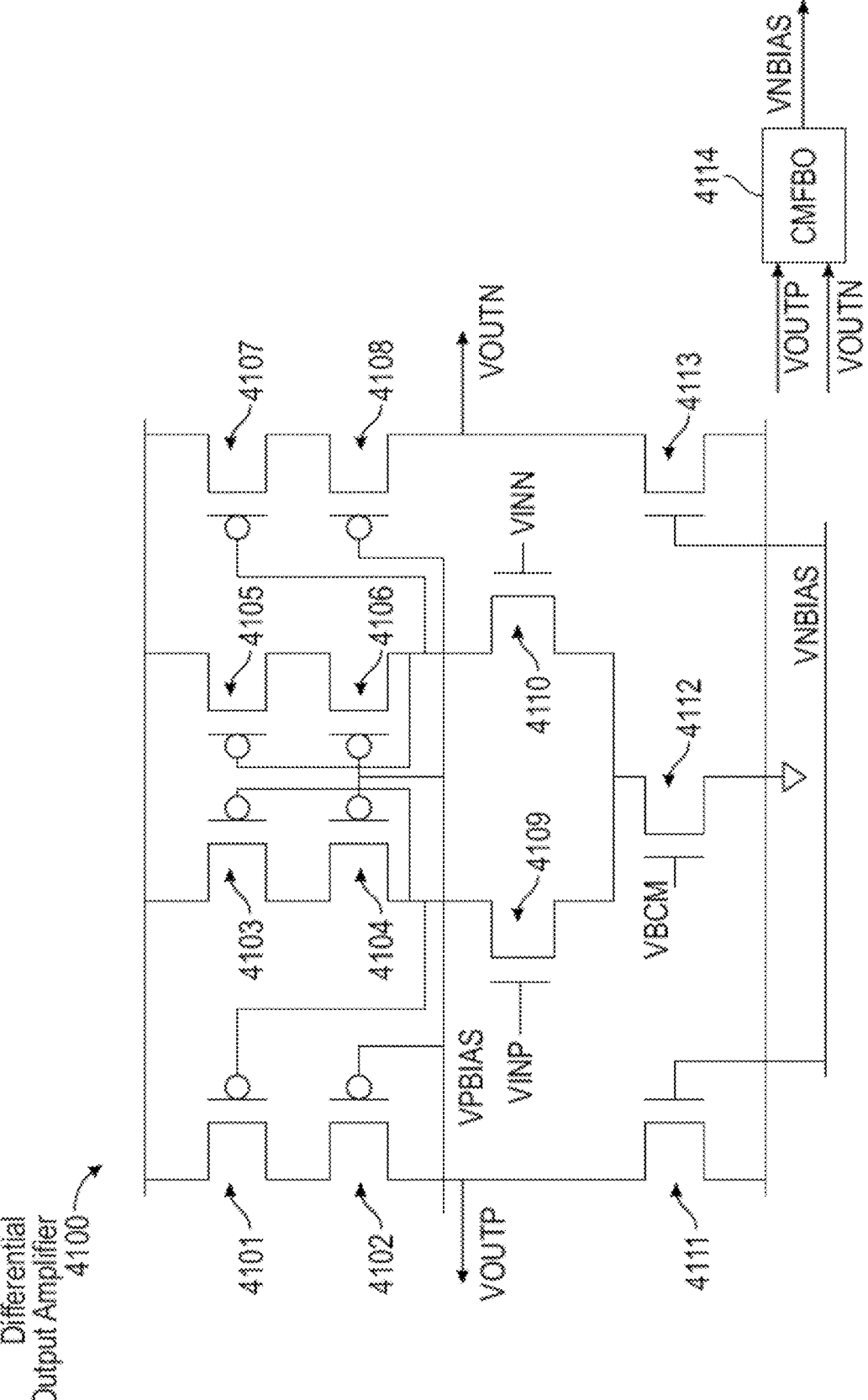
FIG. 41 depicts a differential output amplifier.

FIG. 41 depicts differential amplifier 4100, which optionally can be included in output block 3500 of FIG. 35A, output block 3550 of FIG. 35B or output block 3600 of FIG. 36. Differential output amplifier 4100 comprises PMOS transistors 4101, 4102, 4103, 4104, 4105, 4106, 4107, and 4108, and NMOS transistors 4109, 4110, 4111, 4112, and 4113, configured as shown. Differential output amplifier 4100 receives inputs VINP and VINN and generates outputs VOUTP and VOUTN. VPBIAS is applied to the gates of PMOS transistors 4102, 4104, 4106, and 4108, and VNBIAS is applied to the gates of NMOS transistors 4111 and 4113. If VINP>VINN, then VOUTP will be high and VOUTN will be low. If VINP<VINN, then VOUTP will be low and VOUTN will be high. A common mode feedback circuit for the output common mode is not shown.

FIG. 42 depicts offset calibration method 4200 for an output block such as output blocks 3500, 3550, 3560, 3570, 3580, 3590, or 3600 described above. The method can be performed within a sub circuit block of the output block such as by an ITV block or by an ADC block.

First, nominal biases are applied to input nodes. The nominal biases can be a mid-point offset trim setting, such as 0 value or an average value (such as an average of a target input range, for input for BLw+ and BLw–) (step 4202).

Second, an increased offset trim setting is applied to one of sub circuit block of the output block (such as the ITV or ADC). (step 4203).

Third, the new trimmed output value of the entire output block is measured and compared against the expected output value to see if the value is within target value of the nominal output value (step 4204). If it is true, the method proceeds to step 4207. If it is not true, then steps 4203 and 4204 are repeated, with the offset trim setting applied to the sub circuit block being increased each time, until the new trimmed output value of the entire output block is within than the expected output value, at which point it proceeds to step 4207.

After a certain number of tries (set by a threshold T), if the new trimmed output value of the entire output block is not within the target of as the expected output value, then the offset trim setting is returned to the nominal offset trim setting then the offset trim setting is decreased from the nominal setting (step 4205).

The new trimmed output value of the entire output block is measured and compared against the expected output value of the entire output block to see if the value is within target value of the expected output value (step 4206). If it is true, the method proceeds to step 4207. If it is not true, then steps 4205 and 4206 are repeated, with the offset trim setting applied to the input nodes being decreased each time, until the new trimmed output value is within the target value of the expected output value, at which point it proceeds to step 4207.

In step 4207, the trimmed value that caused the output value to be within target value of the expected output value is stored as the stored trim value. That is the trim value that will result in the smallest offset by the output block.

In step 4208, optionally, the stored trimmed value is added as a bias to the sub-circuit block of the output block during every operation.

Thus, offset calibration method 4200 performs a trim operation on the entire output block by trimming a sub-circuit block of the output block.

FIG. 43 depicts offset calibration method 4300 for an output block, such as output blocks 3500, 3550, 3560, 3570, 3580, 3590, or 3600 described above. The method can be performed within a sub-circuit block such as an ITV block or by an ADC block First, reference biases are applied to the input nodes (such as input for BLw+ and BLw−) of a sub-circuit block of the output block (step 4301).

Next, the output value of the output block is measured and compared against a target offset value (step 4302).

If the measured output value>target offset value, then the next offset trim value in a sequence of offset trim values is applied (step 4303), and step 4302 is repeated. The offset trim is applied to one of sub circuit block of the output block (such as the ITV or ADC).

Steps 4303 and 4302 are repeated until the measured output value<=target offset value, at which point the offset trim value is stored (step 4304). That is the trim value that results in an acceptable level of offset.

Optionally, the stored offset trim value is applied as a bias to the sub-circuit block of the output block during every operation (step 4305).

In alternative embodiments, the variable resistors in FIG. 35E or 40B are not equal in resistance. In this case output voltages or currents from the ITV are proportional to the resistance values. For example, in FIG. 35E, the resistor 3585-1 can be very large, then most of current from two bitlines (IBLw+−IBLw−) will flow through the resistor 3584-1. In another example in FIG. 35E, the resistor 3585-1 is disconnected, then all of the current from two bitlines (IBLw+−IBLw−) will flow through the resistor 3584-1.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/ elements therebetween, as well as forming the element indirectly on the substrate with one or more intermediate materials/elements there between.

What is claimed is:

1. An output current neuron circuit, comprising:
a first bit line coupled to a W+ cell in a memory array to draw a first current during a read operation;
a second bit line coupled to a W− cell in the memory array to draw a second current during a read operation, wherein a difference between a value stored in the W+ cell and a value stored in the W− cell is a weight value, W;
a bias circuit to generate a common mode bias voltage;
a first variable current source to apply a first common mode bias current to the first bit line in response to the common mode bias voltage to generate a first output; and
a second variable current source to apply a second common mode bias current to the second bit line in response to the common mode bias voltage to generate a second output, wherein the first and second common mode bias currents are identical;
wherein the first output equals the common mode bias current minus the first current and the second output equals the common mode bias current minus the second current.

2. The output current neuron circuit of claim 1, wherein the first variable current source comprises a first PMOS transistor.

3. The output current neuron circuit of claim 2, wherein the second variable current source comprises a second PMOS transistor.

4. An output current neuron circuit, comprising:
a current source;
a bias circuit to apply a control voltage to the current source;
a first variable resistor comprising a first end and a second end, the first end coupled to the current source;
a second variable resistor comprising a third end and a fourth end, the third end coupled to the current source, the current source to provide a bias current to the first variable resistor and the second variable resistor so as to generate a common mode voltage;
a first bit line coupled to a W+ cell during a read operation;
a second bit line coupled to a W− cell during the read operation, wherein a difference between a value stored in the W+ cell and a value stored in the W− cell is a weight value, W;

a first output coupled to the second end of the first variable resistor and the first bit line to provide a first output current; and a second output coupled to the fourth end of the second variable resistor and the second bit line to provide a second output current, the first output and the second output forming a common mode, differential current signal.

5. The circuit of claim 4, wherein the first variable resistor comprises an NMOS transistor, where a voltage applied to a gate of the NMOS transistor determines a resistance of the NMOS transistor.

6. The circuit of claim 5, wherein the second variable resistor comprises a second NMOS transistor, where a voltage applied to a gate of the second NMOS transistor determines the resistance of the NMOS transistor.

7. An output current neuron circuit, comprising:

a first output node to receive a first current from a memory array;

a second output node to receive a second current from a memory array;

a bias circuit to generate a bias current;

a first device to generate a first output current equal to the first current subtracted from the bias current; and a second device to generate a second output current equal to the second current subtracted from the bias current.

8. The output current neuron circuit of claim 7, wherein the first current is generated from a read operation of a bit line coupled to one or more W+ cells.

9. The output current neuron circuit of claim 8, wherein the second current is generated from a read operation of a bit line coupled to one or more W− cells.

10. An output current neuron circuit, comprising:

a first output node to receive a first current from a memory array;

a second output node to receive a second current from a memory array;

a bias circuit to generate a bias voltage at a bias node;

a first variable resistor coupled between the bias node and the first output node; and a second variable resistor coupled between the bias node and the second output node.

11. An output block, comprising:

an output current neuron circuit, comprising:

a first bit line coupled to a W+ cell in a memory array to draw a first current during a read operation; and a second bit line coupled to a W− cell in the memory array to draw a second current during the read operation;

a first bias current coupled to the first bit line; and a first output current which is proportional to a difference between the first and second current;

wherein the first output current is equal to half of the difference between the first and second current.

12. An output block, comprising:

an output current neuron circuit, comprising:

a first bit line coupled to a W+ cell in a memory array to draw a first current during a read operation; and a second bit line coupled to a W− cell in the memory array to draw a second current during the read operation;

a first bias current coupled to the first bit line;

a first output current which is proportional to a difference between the first and second current; and a second output current that is complementary to the first output current.

* * * * *